United States Patent
Yamamoto et al.

(10) Patent No.: US 8,384,153 B2
(45) Date of Patent: Feb. 26, 2013

(54) SEMICONDUCTOR DEVICE AND MANUFACTURING METHOD OF THE SAME

(75) Inventors: Tsuyoshi Yamamoto, Kariya (JP);
Masakiyo Sumitomo, Okazaki (JP);
Hitoshi Yamaguchi, Nisshin (JP);
Nozomu Akagi, Nukata (JP); Yuma Kagata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/177,707

(22) Filed: Jul. 7, 2011

(65) Prior Publication Data

US 2012/0007173 A1      Jan. 12, 2012

(30) Foreign Application Priority Data

Jul. 12, 2010  (JP) .................................. 2010-158004
May 19, 2011  (JP) .................................. 2011-112587

(51) Int. Cl.
*H01L 21/336* (2006.01)
(52) U.S. Cl. ........................................ 257/330; 438/270
(58) Field of Classification Search .................. 257/330, 257/E29.262, E21.41; 438/242, 243, 259
See application file for complete search history.

(56) References Cited

U.S. PATENT DOCUMENTS

| | | | |
|---|---|---|---|
| 5,493,134 A * | 2/1996 | Mehrotra et al. ............. | 257/132 |
| 7,326,975 B2 * | 2/2008 | Kim et al. ..................... | 257/269 |
| 2004/0135228 A1 | 7/2004 | Iwamoto et al. | |
| 2007/0132012 A1 | 6/2007 | Saito | |
| 2008/0116512 A1 | 5/2008 | Kawaguchi et al. | |
| 2008/0283913 A1 | 11/2008 | Shibata et al. | |
| 2010/0123187 A1 * | 5/2010 | Burke et al. .................. | 257/330 |
| 2012/0261746 A1 * | 10/2012 | Darwish et al. ............... | 257/330 |

FOREIGN PATENT DOCUMENTS

| | | |
|---|---|---|
| JP | A-2002-16250 | 1/2002 |
| JP | A-2004-134714 | 4/2004 |
| JP | A-2009-43966 | 2/2009 |
| JP | A-2009-105219 | 5/2009 |

* cited by examiner

*Primary Examiner* — Thao P. Le
(74) *Attorney, Agent, or Firm* — Posz Law Group, PLC

(57) ABSTRACT

A semiconductor device includes: a substrate; multiple first and second conductive type regions on the substrate for providing a super junction structure; a channel layer on the super junction structure; a first conductive type layer in the channel layer; a contact second conductive type region in the channel layer; a gate electrode on the channel layer via a gate insulation film; a surface electrode on the channel layer; a backside electrode on the substrate opposite to the super junction structure; and an embedded second conductive type region. The embedded second conductive type region is disposed in a corresponding second conductive type region, protrudes into the channel layer, and contacts the contact second conductive type region. The embedded second conductive type region has an impurity concentration higher than the channel layer, and has a maximum impurity concentration at a position in the corresponding second conductive type region.

19 Claims, 19 Drawing Sheets

SEMICONDUCTOR DEVICE AND MANUFACTURING METHOD OF THE SAME

CROSS REFERENCE TO RELATED APPLICATIONS

This application is based on Japanese Patent Applications No. 2010-158004 filed on Jul. 12, 2011, and No. 2011-112587 filed on May 19, 2011, the disclosures of which are incorporated herein by reference.

TECHNICAL FIELD

The present invention relates to a semiconductor device having a super junction structure and a manufacturing method of a semiconductor device having a super junction structure.

BACKGROUND

Conventionally, an avalanche resistance in a trench gate type super junction MOS transistor in a semiconductor device is improved, and the device is disclosed in JP-A-2008-288367 corresponding to US 2008/0283913 and JP-A-2009-43966. In the device, the super junction structure is formed such that a P conductive type region and a N conductive type region are alternately arranged in a substrate having a N conductive type along with a direction in parallel to the surface of the substrate. A P conductive type channel layer is formed in a surface portion of the super junction structure. A $N^+$ conductive type source region is formed in a surface portion of the channel layer, and the source region is opposite to the N conductive type region in the super junction structure. A contact $P^+$ conductive type region is formed in a surface portion of the channel layer, and the $P^+$ conductive type region is opposite to the P conductive type region in the super junction structure. The impurity concentration of the $P^+$ conductive type region is higher than the P conductive type channel layer. An embedded $P^+$ conductive type region is formed in the P conductive type channel layer such that the embedded $P^+$ conductive type region contacts the contact $P^+$ conductive type region. The impurity concentration of the embedded $P^+$ conductive type region is higher than the P conductive type channel layer.

A trench is formed such that the trench penetrates the source region and the channel layer, and reaches the N conductive type region. A gate electrode is formed on an inner wall of the trench via a gate insulation film. Thus, the trench, the gate insulation film and the gate electrode provide the trench gate structure. Here, the embedded $P^+$ conductive type region is formed between adjacent two trenches.

In the semiconductor device, an avalanche current generated in the super junction structure is discharged to the contact $P^+$ conductive type region via the $P^+$ conductive type region. Specifically, when the break down occurs at the P conductive type region, the avalanche current is flown from the embedded $P^+$ conductive type region to the contact $P^+$ conductive type region. Further, when the break down occurs at the N conductive type region, the avalanche current is flown from to the contact $P^+$ conductive type region via the P conductive type channel layer on the N conductive type region and the embedded $P^+$ conductive type region, which has the impurity concentration higher than the P conductive type channel layer.

Accordingly, a parasitic bipolar transistor is restricted from functioning. The parasitic bipolar transistor is driven by flowing the avalanche current through the channel layer on the trench side and the source region. Thus, the avalanche resistance is improved.

Further, a planar type semiconductor device having a super junction structure is disclosed in JP-A-2002-16250. Specifically, in the device, a P conductive type base region is formed in a surface portion of the P conductive type region in the super junction structure. A $N^+$ conductive type source region is formed in a surface portion of the base region. A groove is formed on the base region, and the groove reaches the P conductive type region. A poly silicon layer is embedded in the groove via an insulation film. A gate electrode is formed on the surface of each of the base region, the source region and the N conductive type region via a gate insulation film. The gate electrode is disposed at a predetermined region of the surface.

Further, JP-A-2007-150142 corresponding to US 2007/0132012 teaches that a planar type semiconductor device having a super junction structure, in which a high impurity concentration layer is formed on the surface of a P conductive type region disposed at a corner of a P conductive type base region. The impurity concentration of the high impurity concentration layer is higher than the P conductive type region. Further, the impurity concentration of the high impurity concentration layer is constant, i.e., locally homogeneous.

However, in JP-A-2002-16250 and JP-A-2007-150142, although the planar type semiconductor device having the super junction structure is disclosed, there is no information about avalanche resistance.

A semiconductor device including a planar type semiconductor device with a super junction structure is disclosed in JP-A-2004-134714. In the device, an avalanche resistance is improved such that a high impurity concentration layer is formed in a surface portion of a P conductive type region. The impurity concentration of the high impurity concentration layer is higher than the P conductive type region, and is locally homogeneous. In this case, a negative resistance is improved, and the avalanche resistance is also improved. Here, in the device, a base layer is arranged between the high impurity concentration layer and a contact $P^+$ conductive type region.

JP-A-2008-288367, JP-A-2009-43966 and JP-A-2004-134714 teaches that the avalanche resistance is improved in the semiconductor device. However, it is required to improve the avalanche resistance much more.

SUMMARY

In view of the above-described problem, it is an object of the present disclosure to provide a semiconductor device having a super junction structure and a manufacturing method of a semiconductor device having a super junction structure. In the semiconductor device, an avalanche resistance is improved.

According to a first aspect of the present disclosure, a semiconductor device includes: a substrate having a first conductive type; a plurality of first conductive type regions and a plurality of second conductive type regions disposed on the substrate, extending in a first direction, and alternately arranged in a second direction so that a super junction structure is provided; a channel layer having a second conductive type and disposed on the super junction structure; a first conductive type layer disposed in a first surface portion of the channel layer; a contact second conductive type region disposed in a second surface portion of the channel layer, which is opposite to a corresponding second conductive type region, and having an impurity concentration higher than the channel layer; a gate insulation film disposed on the channel layer; a gate electrode disposed on the gate insulation film; a surface electrode disposed on the channel layer; a backside electrode disposed on the substrate opposite to the super junction structure; and an embedded second conductive type region. A current flows between the surface electrode and the backside electrode. The embedded second conductive type region is disposed in a corresponding second conductive type region, protrudes into the channel layer, and contacts the contact second conductive type region. The embedded second conductive type region has an impurity concentration higher than the channel layer, and has a maximum impurity concentration at a position in the corresponding second conductive type region.

In the above semiconductor, the electric field easily concentrates around the embedded second conductive type region. Thus, a breakdown easily occurs around the embedded second conductive type region. Accordingly, an avalanche current easily flows from the embedded second conductive type region to the contact second conductive type region, so that an avalanche resistance is improved.

According to a second aspect of the present disclosure, a method for manufacturing a semiconductor device includes: forming a first conductive type region film on a substrate having a first conductive type; forming a plurality of first trenches on the first conductive type region film to reach the substrate so that the first conductive type region film is divided into a plurality of first conductive type regions, which are separated from each other with the first trenches; filling each first trench with a second conductive type region film; polishing a surface of the second conductive type region film so that the second conductive type region film is divided into a plurality of second conductive type regions, and the first conductive type regions and the second conductive type regions provide a super junction structure, wherein the first conductive type regions and the second conductive type regions extend in a first direction, and wherein the first conductive type regions and the second conductive type regions are alternatively arranged in a second direction; implanting a second conductive type impurity into the second conductive type regions; forming a channel layer having a second conductive type on the super junction structure; forming a plurality of second trenches to penetrate the channel layer and to reach a corresponding first conductive type region, wherein the second trenches have a stripe pattern; forming a gate insulation film on an inner wall of each second trench, and forming a gate electrode on the gate insulation film in each second trench, so that the second trenches, the gate insulation film and the gate electrode provide a trench gate structure; implanting a first conductive type impurity into a surface portion of the channel layer; implanting a second conductive type impurity into another surface portion of the channel layer; and heating the substrate so that the second conductive type impurity in the channel layer is diffused, and a contact second conductive type region is formed in the another surface portion of the channel layer, which is opposite to a corresponding second conductive type region. The contact second conductive type region has an impurity concentration higher than the channel layer. In the heating of the substrate, the first conductive type impurity in the channel layer is diffused, and a first conductive type layer is formed in the surface portion of the channel layer. The first conductive type layer has the first conductive type, and contacts a sidewall of a corresponding trench. In the heating of the substrate, the second conductive type impurity in the second conductive type regions is diffused, and an embedded second conductive type region is formed in a corresponding second conductive type region. The embedded second conductive type region has an end, which protrudes into the channel layer and contacts the contact second conductive type region. The embedded second conductive type region has the other end, which is deeper than a bottom of a corresponding trench. The embedded second conductive type region has an impurity concentration higher than the channel layer, and has a maximum impurity concentration at a position in the corresponding second conductive type region.

In the above method, the thermal treatment temperature is low, and the thermal treatment time is short. Thus, the charge balance between the first and second conductive type regions is not changed.

According to a third aspect of the present disclosure, a method for manufacturing a semiconductor device includes: forming a first conductive type region film on a substrate having a first conductive type; forming a plurality of first trenches on the first conductive type region film to reach the substrate so that the first conductive type region film is divided into a plurality of first conductive type regions, which are separated from each other with the first trenches; filling each first trench with a second conductive type region film, and forming the second conductive type region film on the first conductive type regions; implanting a second conductive type impurity into the second conductive type region film in each trench with using the second conductive type region film on the first conductive type regions as a mask; polishing a surface of the second conductive type region film so that the second conductive type region film is divided into a plurality of second conductive type regions, and the first conductive type regions and the second conductive type regions provide a super junction structure, wherein the first conductive type regions and the second conductive type regions extend in a first direction, and wherein the first conductive type regions and the second conductive type regions are alternatively arranged in a second direction; forming a channel layer having a second conductive type on the super junction structure; forming a plurality of second trenches to penetrate the channel layer and to reach a corresponding first conductive type region, wherein the second trenches have a stripe pattern; forming a gate insulation film on an inner wall of each second trench, and forming a gate electrode on the gate insulation film in each second trench, so that the second trenches, the gate insulation film and the gate electrode provide a trench gate structure; implanting a first conductive type impurity into a surface portion of the channel layer; implanting a second conductive type impurity into another surface portion of the channel layer; and heating the substrate so that the second conductive type impurity in the channel layer is diffused, and a contact second conductive type region is formed in the another surface portion of the channel layer, which is opposite to a corresponding second conductive type region. The contact second conductive type region has an impurity concentration higher than the channel layer. In the heating of the substrate, the first conductive type impurity in the channel layer is diffused, and a first conductive type layer is formed in the surface portion of the channel layer. The first conductive type layer has the first conductive type, and contacts a sidewall of a corresponding trench. In the heating of the substrate, the second conductive type impurity in the second conductive type regions is diffused, and an embedded second conductive type region is formed in a corresponding second conductive type region. The embedded second conductive type region has an end, which protrudes into the channel layer and contacts the contact second conductive type region. The embedded second conductive type region has the other end, which is deeper than a bottom of a corresponding trench. The embedded second conductive type region has an impurity concentration higher than the channel layer, and has a maximum impurity concentration at a position in the corresponding second conductive type region.

In the above method, it is not necessary to prepare a new mask, so that the manufacturing method is simplified.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

First Embodiment

Figure 1:
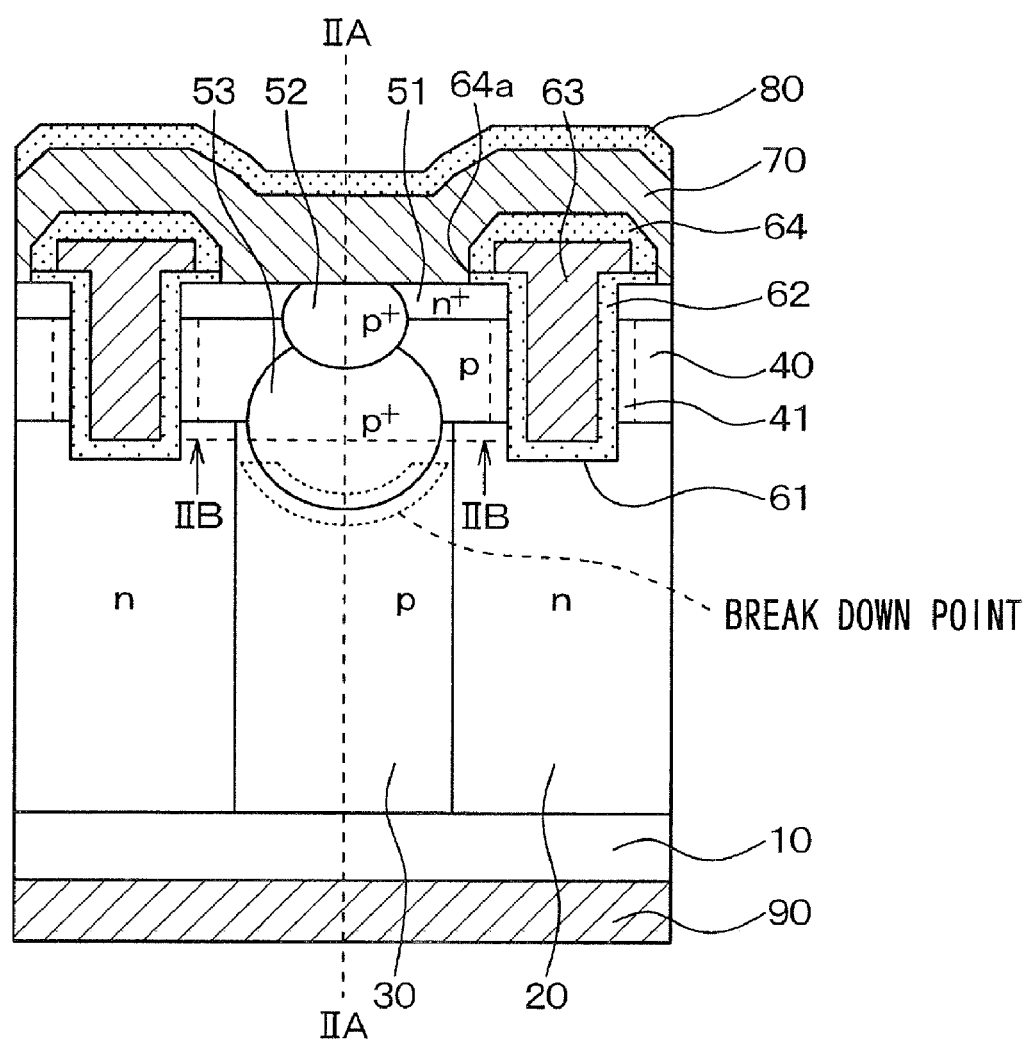
FIG. 1 is a diagram showing a cross sectional view of a semiconductor device according to a first embodiment.

FIG. 1 shows a semiconductor device according to a first embodiment. The device has a trench gate structure. The device may be suitably used for a switching device, which provides an inverter circuit.

As shown in FIG. 1, N conductive type regions 20 and P conductive type regions 30 are formed on a $N^+$ conductive type substrate 10. Each N conductive type region 20 extends along with a predetermined direction (which is a direction perpendicular to the drawing in FIG. 1), and has a columnar shape. Each P conductive type region 30 extends along with the predetermined direction (which is the direction perpendicular to the drawing in FIG. 1), and has a columnar shape. Thus, the N conductive type regions 20 and the P conductive type regions 30 are alternately arranged along with a direction in parallel to the surface of the substrate 10 so that a super junction structure is formed.

Specifically, in the device in FIG. 1, an alternate arrangement structure of the N conductive type regions 20 and the P conductive type regions 30 is formed along with an alternate arrangement direction. The N conductive type regions 20 are defined as N columns, and the P conductive type regions 30 are defined as P columns. The super junction structure provides a super junction layer.

A P conductive type channel layer 40 is formed in a surface portion of the super junction layer, i.e., a surface portion of each of the N columns 20 and the P columns 30. A $N^+$ conductive type source region 51 for providing a first conductive type layer is formed in a surface portion of the P conductive type channel layer 40. The source region 51 is opposite to the N column 20. A contact $P^+$ conductive type region 52 is formed in a surface portion of the P conductive type channel layer 40. The contact $P^+$ conductive type region 52 is opposite to the P column 30. The contact $P^+$ conductive type region 52 has an equivalent concentration line in a cross section of the region 52, which is curved with a curvature. The outer periphery of the region 52 has a curved shape with a curvature. Specifically, the region 53 has an ellipsoidal (oval or egg) cross section. The source region 51 and the contact $P^+$ conductive type region 52 extend along with a direction in parallel to the longitudinal direction of the N column 20 and the P column 30.

Multiple trenches 61 penetrate through the source region 51 and the channel layer 40, and reach the N column 20. The trenches 61 have a stripe pattern. A gate insulation film 62 and a gate electrode 63 are formed on an inner wall of the trench 61 in this order. Thus, the trench 61, the gate insulation film 62 and the gate electrode 63 provide the trench gate structure.

In the present embodiment, the trench 61 extends along with a direction in parallel to the longitudinal direction of the N column 20. The $N^+$ conductive type source region 51 is formed on both sides of the sidewall of the trench 61. The contact $P^+$ conductive type region 52 is arranged between two adjacent trenches 61. In the present embodiment, a portion of the channel layer 40 contacting the sidewall of the trench 61 provides a channel.

One end of the P column 30 protrudes into the channel layer 40 and contacts the contact P+ conductive type region 52. The other end of the P column 30 is deeper than the trench 61. The embedded P+ conductive type region 53 is formed in the P column 30. The embedded P+ conductive type region 53 extends along with a direction in parallel to the longitudinal direction of the P column 30. The embedded P+ conductive type region 53 provides a pathage for flowing avalanche current to the contact P+ conductive type region 52.

The embedded P+ conductive type region 53 has a cross sectional shape with a curvature, and an equivalent concentration line in the region 53 is curved. The outer periphery of the region 53 is curved with a curvature. Specifically, the region 53 has an ellipsoidal (oval or egg) cross section. A length of the region 53 in a direction perpendicular to the extending direction of the region 53 and in parallel to the surface of the substrate 10 is defined as a width of the region 53. Thus, the width of the region 53 is measured in a right-left direction of the drawing in FIG. 1. The maximum width of the region 53 is narrower than the width of the P column 30. Further, the maximum width of the region 53 is wider than the maximum width of the region 52. The region 53 is disposed in the channel layer 40 and the P column 30.

Further, the region 53 has an impurity concentration higher than the channel layer 40. A position of the region 53, at which the impurity concentration is maximum, is disposed in the P column 30, so that the region 53 has an impurity concentration distribution with the peak impurity concentration at the position of the region 53 in the P column 30. Specifically, the impurity concentration distribution of the region 53 has the peak impurity concentration on the substrate side from the boundary between the channel layer 40 and the P column 30 or the N column 20. The region 53 has an impurity concentration substantially equal to the P column 30 at a position of the region 53, which is deeper than the bottom of the trench 61.

Figure 2A:
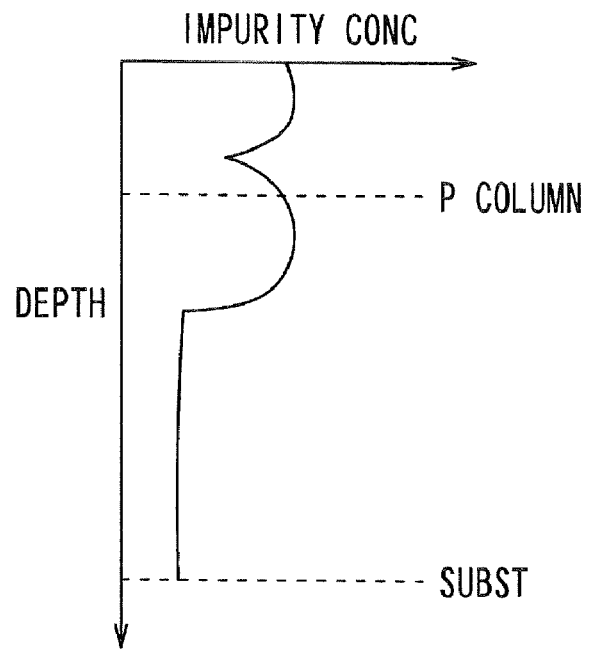
FIG. 2A is a graph showing an impurity concentration in the device along line IIA-IIA in FIG. 1.
Figure 2B:
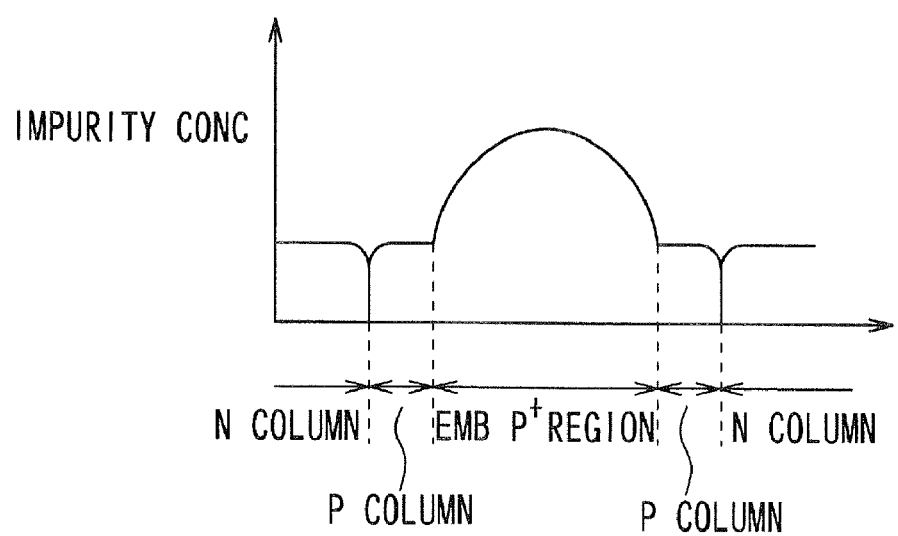
FIG. 2B is a graph showing an impurity concentration in the device along line IIB-IIB in FIG. 1.

FIG. 2A shows an impurity concentration of the device along with the line IIA-IIA in FIG. 1. FIG. 2B shows an impurity concentration of the device along with the line IIB-IIB in FIG. 1. As shown in FIG. 2A, the impurity concentration in the P column 30 is constant, i.e., locally homogeneous. The surface portion of the region 52 has a peak impurity concentration. As shown in FIG. 2B, the region 53 has an impurity concentration distribution, and the impurity concentration at a middle portion of the region 53 is highest.

The gate electrode 63 is covered with an interlayer insulation film 64. A source electrode 70 is formed on the channel layer 40 via a contact hole 64a I the interlayer insulation film 64 so that the source electrode 70 is electrically coupled with the source region 51 and the contact P+ conductive type region 52. The source electrode 70 is covered with a protection film 80. A drain electrode 90 is formed on a backside of the substrate 10. The drain electrode 90 is electrically coupled with the substrate 10. In the present embodiment, the drain electrode provides a backside electrode. Thus, a whole construction of the semiconductor device is explained.

Next, a manufacturing method of the semiconductor device will be explained with reference to FIGS. 3A to 3G.

Figure 3A:
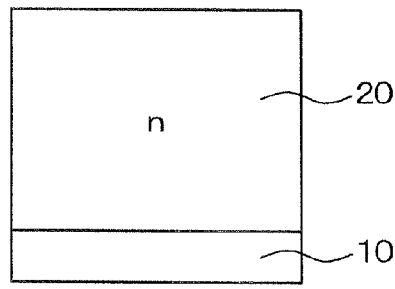
FIGS. 3A to 3G are diagrams showing a manufacturing method of the semiconductor device in FIG. 1.
Figure 3B:
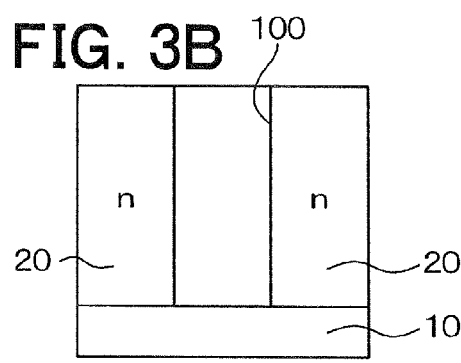
Figure 3C:
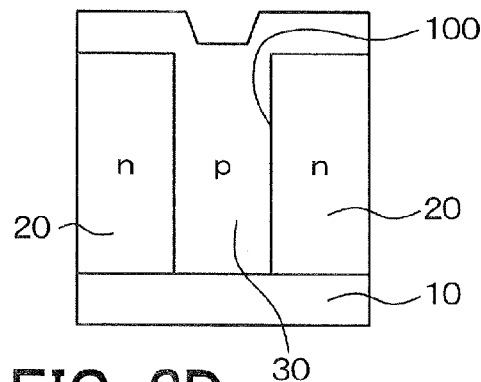
Figure 3D:
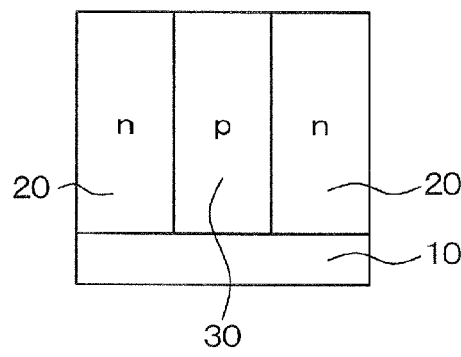

As shown in FIG. 3A, the N+ conductive type substrate 10 is prepared. The N conductive type region 20 is epitaxially grown on the substrate 10. Next, as shown in FIG. 3B, a trench 100 is formed on the N conductive type region 20 by a dry etching method such as a RIE (i.e., reactive ion etching) method. The trench 100 reaches the substrate 10. Thus, multiple N columns 20 are formed on the substrate 10 such that the N columns 20 are separated from each other. Then, as shown in FIG. 3C, the P conductive type region 30 is embedded in the trench 100 such that the P conductive type region 30 is epitaxially grown in the trench 100. Then, as shown in FIG. 3D, the surface of the P conductive type region 30 is polished by a CMP method. Thus, the super junction structure having the N columns 20 and the P columns 30 alternately arranged on the substrate 10 is formed.

Figure 3E:
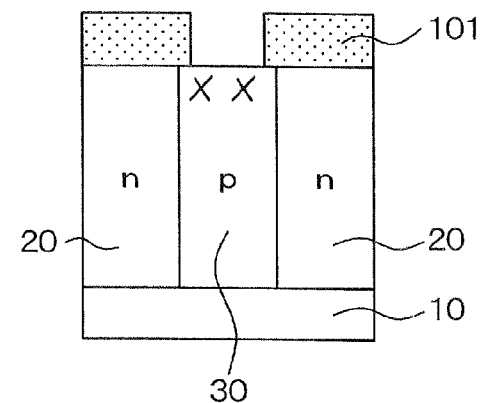
Figure 3F:
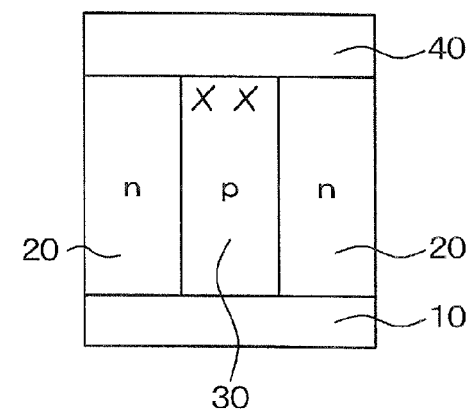

Then, as shown in FIG. 3E, a resist 101 is formed on the super junction structure, and the resist 101 is patterned such that the resist 101 has an opening corresponding to the P column 30. Specifically, the opening of the resist 101 corresponds to an embedded-P+-conductive-type-region-to-be-formed region. A P conductive type impurity such as boron is implanted on the P column 30 with using the resist 101 as a mask. The P conductive type impurity is implanted by adjusting an acceleration voltage so that the implanted impurity is diffused to a position deeper than the bottom of the trench 61 when a thermal treatment is performed in a step of FIG. 3G. Then, the resist 101 is removed, and, as shown in FIG. 3F, the P conductive type channel layer 40 is epitaxially formed on the surface of the super junction structure.

Figure 3G:
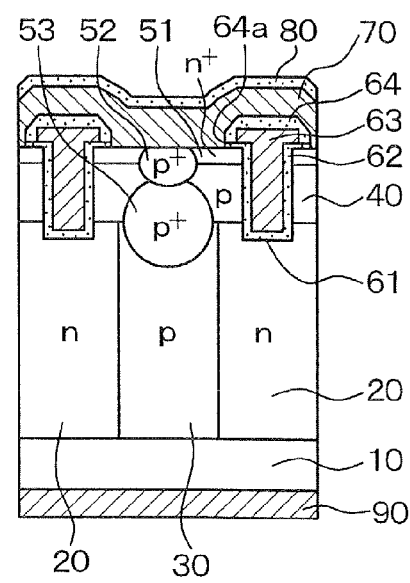

Then, as shown in FIG. 3G, a predetermined semiconductor manufacturing process is executed so that the semiconductor device is manufactured. Specifically, a resist (not shown) is formed on the channel layer 10, and the resist is patterned such that an opening of the resist corresponds to the N column 20. Next, the trench 61 is formed with using the resist as a mask by a dry etching method such as a RIE method. The trench 61 penetrates through the channel layer 40, and reaches the N column 20.

Then, the gate insulation film 62 is formed on the inner wall of the trench 61 by a thermal oxidation method, a CVD method or the like. Further, a poly silicon film is formed on the gate insulation film 62 by the CVD method or the like. Thus, the gate electrode 63 is formed so that the trench 61, the gate insulation film 62 and the gate electrode 63 provide the trench gate structure.

Next, a resist (not shown) is formed on the channel layer 40, and the resist is patterned such that an opening of the resist corresponds to the N+-conductive-type-source-region-to-be-formed region. With using the resist as a mask, a N conductive type impurity such as phosphorous is implanted in a surface portion of the channel layer 40 on the sidewall of the trench 61. Similarly, a resist (not shown) is formed on the channel layer 40, and the resist is patterned such that an opening of the resist corresponds to a contact-P+-conductive-type-region-to-be-formed region. With using the resist as a mask, the P conductive type impurity is implanted in a surface portion of the channel layer 40, which is sandwiched between the source region 51. Specifically, the P conductive type impurity is implanted in an embedded-P+-conductive-type-region-to-be-formed region. Then, the substrate 10 is heated at 1000° C. to 1050° C. so that the P conductive type impurity is diffused. Thus, the embedded P+ conductive type region 53, the N+ conductive type source region 51 and the contact P+ conductive type region 52 are formed. Here, the heat treatment is controlled such that the embedded P+ conductive type region 53 contacts the contact P+ conductive type region 52, has the depth deeper than the bottom of the trench 61, and does not protrude into the N column 20. After that, the source electrode 70, the protection film 80, the drain electrode 90 and the like are formed, so that the semiconductor device is completed.

When the semiconductor device turns on, an inversion layer 41 is formed in a part of the channel layer 40 facing the gate electrode 63. The current flows from the source region 51 to the N column 20 via the inversion layer 41.

Next, a case where the avalanche current flows in the device will be explained. In the device in FIG. 1, the depth of the embedded P+ conductive type region 53 is deeper than the bottom of the trench 61. Thus, the electric field may concentrate under the embedded P+ conductive type region 53, which is lower than the bottom of the trench 61. Accordingly, as shown in FIG. 1, the breakdown may occur at a part of the boundary between the P+ conductive type region 53 and the P column 30, which is lower (i.e., deeper) than the bottom of the trench 61, and disposed on the substrate side.

When the breakdown occurs under the embedded P+ conductive type region 53, the avalanche current flows from the embedded P+ conductive type region 53 to the contact P+ conductive type region 52. Further, if the breakdown occurs in the N column 20, the avalanche current flows into the channel 40 on the N column 20, and then, the current flows to the contact P+ conductive type region 52 via the embedded P+ conductive type region 53, which has the impurity concentration higher than the channel layer 40.

Thus, in the above semiconductor device, when the breakdown occurs, the avalanche current flows to the contact P+ conductive type region 52 via the embedded P+ conductive type region 53, so that the avalanche resistance is improved.

As described above, in the semiconductor device according to the present embodiment, the embedded P+ conductive type region 53 has one end contacting the contact P+ conductive type region 52 and the other end disposed in the P column 30, and the embedded P+ conductive type region 53 is deeper than the trench 61. Accordingly, the electric field is concentrated under the embedded P+ conductive type region 53 rather than the bottom of the trench 61. Thus, the breakdown occurs under the embedded P+ conductive type region 53. In this case, the avalanche current generated under the embedded P+ conductive type region 53 flows to the contact P+ conductive type region 52 via the embedded P+ conductive type region 53. Even if the breakdown occurs in the N column 20, the avalanche current can flow to the contact P+ conductive type region 52 via the embedded P+ conductive type region 53 and the P conductive type channel layer 40. Thus, the function of the parasitic bipolar transistor is restricted, and therefore, the avalanche resistance is improved.

Further, in the semiconductor device, the embedded P+ conductive type region 53 is arranged in the P conductive type channel layer 40 and the P column 30. Accordingly, the embedded P+ conductive type region 53 does not protrude in the N column 20. Thus, the current path provided by the P conductive type channel layer 40 on the sidewall of the trench 61 is sufficiently secured without enlarging the distance between adjacent trenches 61. Thus, the increase of the on-state resistance is restricted, and the increase of the dimensions of the semiconductor device is restricted.

Further, the embedded P+ conductive type region 53 has the maximum impurity concentration in the P column 30. The impurity concentration distribution around the boundary between the embedded P+ conductive type region 53 and the P column 30 can be rapidly changed, compared with a case where the embedded P+ conductive type region has the maximum impurity concentration in the P conductive type channel layer 40, i.e., a conventional case where the P conductive type impurity is implanted in the P conductive type channel layer 40, and the P conductive type impurity is thermally diffused so that the embedded P+ conductive type region is formed. Thus, the electric field is easily concentrated under the embedded P+ conductive type region 53. Since the intensity of the electric field under the embedded P+ conductive type region 53 is maximized, so that the breakdown occurs under the embedded P+ conductive type region 53. The avalanche current flows from the embedded P+ conductive type region 53 to the contact P+ conductive type region 52. Thus, the avalanche resistance is improved.

Since the embedded P+ conductive type region 53 has the maximum impurity concentration in the P column 30, the impurity concentration distribution around the boundary between the embedded P+ conductive type region 53 and the P column 30 can be rapidly changed, compared with a case where the high impurity concentration layer has no impurity concentration distribution in the semiconductor device described in JP-A-2009-43966, JP-A-2002-16250, JP-A-2007-150142 and JP-A-2004-134714 when the high impurity concentration layer has the impurity concentration equal to the periphery of the embedded P+ conductive type region 53 in the present embodiment. Thus, the avalanche resistance is much improved.

Furthermore, the embedded P+ conductive type region 53 has a cross sectional shape having a curvature of the equivalent concentration line. The outline of the embedded P+ conductive type region 53 provides the ellipsoidal shape. Accordingly, the electric field is easily concentrated around the embedded P+ conductive type region 53 in a wide area, compared with a case where the outline of the embedded P+ conductive type region 53 provides a rectangular shape. Thus, the area, at which the breakdown occurs, is enlarged, and therefore, the operation resistance is reduced.

In the manufacturing method of the semiconductor device, the P conductive type impurity is implanted in the P column 30, and the P conductive type impurity is thermally diffused, so that the embedded P+ conductive type region 53 is prepared. Accordingly, when the P conductive type impurity is diffused to the same depth, the thermal processing temperature is low and the thermal processing time is short in the manufacturing method of the semiconductor device according to the present embodiment, compared with a case where the P conductive type impurity is implanted in the P conductive type channel layer 40, and the P conductive type impurity is thermally diffused so that the embedded P+ conductive type region 53 is prepared. Thus, the charge balance between the N column 20 and the P column 30 is appropriately controlled, i.e., the charge balance is not broken. Thus, the reduction of the breakdown voltage is restricted. Further, since the thermal processing temperature is reduced, and the thermal processing time is shortened, the embedded P+ conductive type region 53 is not diffused into the N column 20. Without increasing the width of the N column 20 and the P column 30, the distance between the trench 61 and the embedded P+ conductive type region 53 is sufficiently secured, so that the increase of the on-state resistance is restricted.

Further, in the present embodiment, the P conductive type impurity is implanted in the P column 30 so that the embedded P+ conductive type region 53 is formed. Accordingly, the increase of the manufacturing cost is restricted. Further, the increase of the manufacturing process is restricted. Specifically, it may be considered that the P conductive type channel layer 40 is formed on the super junction structure, and the P conductive type impurity is implanted in the P column 30 via the P conductive type channel layer 40. However, in this case, since the impurity is implanted via the P conductive type channel layer 40, it is necessary to increase the acceleration energy, and therefore, the manufacturing cost increases since it is necessary to prepare a large equipment. Further, since the embedded depth is deep, it is necessary to increase the charge of the P conductive type impurity to be implanted. In an ordinary equipment, a beam current is small, so that it takes much time to generate an ion corresponding to the impurity. Thus, the manufacturing time becomes long. However, in the present embodiment, the P conductive type impurity is directly implanted into the P column 30. Accordingly, it is not necessary to prepare a large equipment, and the manufacturing process does not increase.

Second Embodiment

Figure 4:
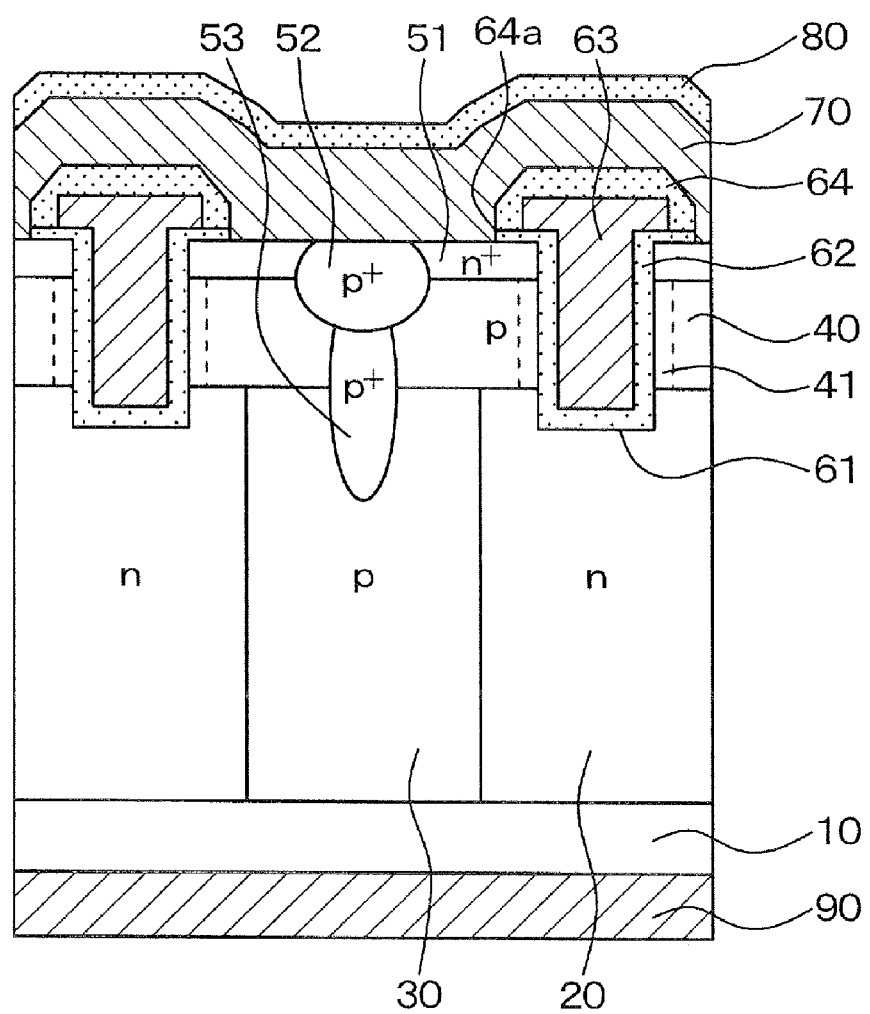
FIG. 4 is a diagram showing a cross sectional view of a semiconductor device according to a second embodiment.

In a semiconductor device according to the present embodiment, the maximum width of the embedded $P^+$ conductive type region 53 is smaller than the maximum width of the contact $P^+$ conductive type region 52. FIG. 4 shows the semiconductor device according to the present embodiment.

As shown in FIG. 4, in the semiconductor device according to the present embodiment, the maximum width of the embedded $P^+$ conductive type region 53 is smaller than the maximum width of the contact $P^+$ conductive type region 52.

Figure 5A:
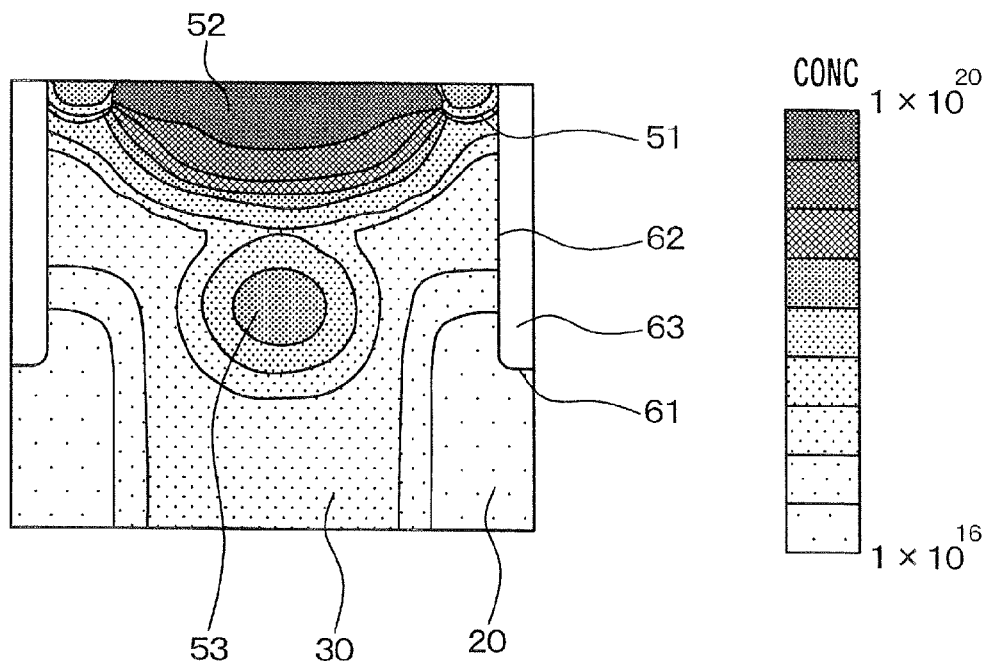
FIG. 5A is a diagram showing a simulation result of an impurity concentration in the semiconductor device in FIG. 4.
Figure 5B:
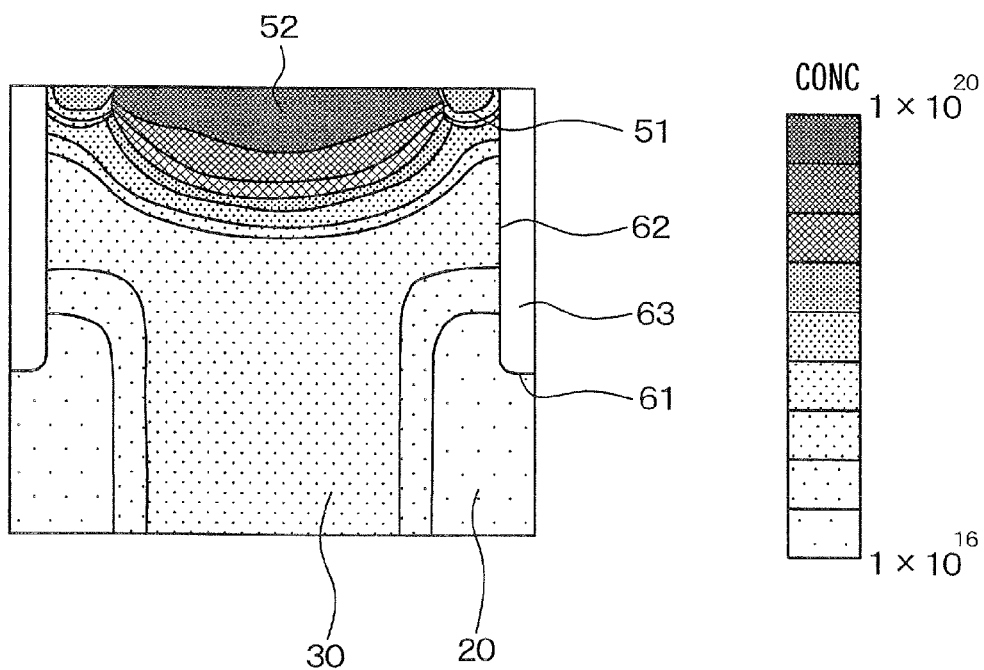
FIG. 5B is a diagram showing a simulation result of an impurity concentration in a conventional semiconductor device without an embedded $P^+$ conductive type region.

FIG. 5A shows a simulation result of the impurity concentration of the present embodiment. FIG. 5B shows a simulation result of the impurity concentration of a conventional semiconductor device without the embedded $P^+$ conductive type region 53. In the semiconductor device according to the present embodiment, the embedded $P^+$ conductive type region 53 is formed in the step shown in FIG. 3E such that the opening width of the resist 101 is 0.9 micrometers, the dose amount is $1.0 \times 10^{14}$ cm$^{-2}$, and the acceleration energy is 100 KeV. As shown in FIGS. 5A and 5B, in the semiconductor device according to the present embodiment, the embedded $P^+$ conductive type region 53 has the maximum impurity concentration in the P column 30.

In the semiconductor device, since the width of the embedded $P^+$ conductive type region 53 is narrower than the contact $P^+$ conductive type region 52, the avalanche current is restricted from being leaked from the embedded $P^+$ conductive type region 53 and flowing into the P conductive type channel layer 40 when the avalanche current flows from the embedded $P^+$ conductive type region 53 to the contact $P^+$ conductive type region 52. Comparing with the first embodiment, the avalanche current is restricted from flowing into the $N^+$ conductive type source region 51. Thus, the avalanche resistance is much improved. Thus, the similar effects as the first embodiment are obtained.

Since the width of the embedded $P^+$ conductive type region 53 is narrower than the width of the contact $P^+$ conductive type region 52, the operation resistance is reduced in a case where the avalanche current flows from the embedded $P^+$ conductive type region 53 to the contact $P^+$ conductive type region 52. The avalanche resistance is much improved.

Further, since the width of the embedded $P^+$ conductive type region 53 is narrower than the width of the contact $P^+$ conductive type region 52, the distance between the inversion layer 41 and the embedded $P^+$ conductive type region 53 is large. Thus, the threshold voltage is stabilized.

Figure 6:
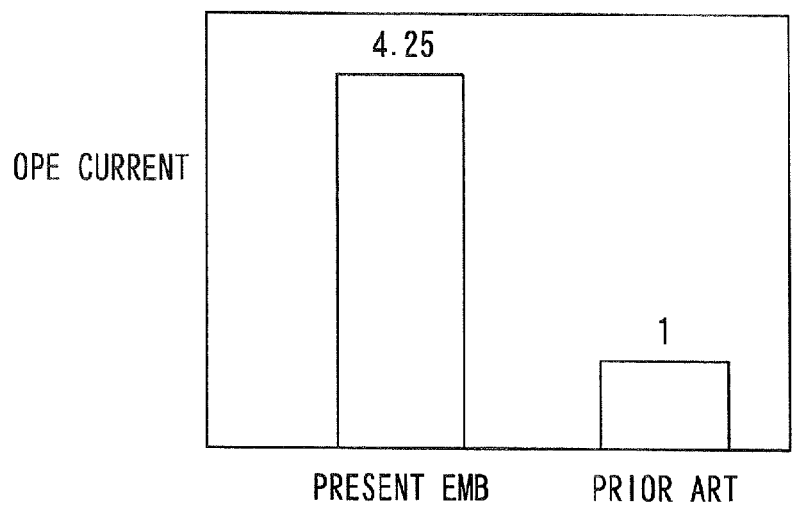
FIG. 6 is a diagram showing operation current of a parasitic bipolar transistor in the semiconductor device in FIG. 4 and in a conventional semiconductor device without an embedded $P^+$ conductive type region.

FIG. 6 shows a simulation result of an operation current of a parasitic bipolar transistor in the semiconductor device according to the present embodiment and a simulation result of an operation current of a parasitic bipolar transistor in a conventional semiconductor device without the embedded $P^+$ conductive type region 53. The embedded $P^+$ conductive type region 53 in the semiconductor device according to the present embodiment is formed under the same condition as the semiconductor device shown in FIG. 5A.

As shown in FIG. 6, when the operation current of the parasitic bipolar transistor in the conventional semiconductor device is defined as one, the operation current of the parasitic bipolar transistor in the semiconductor device according to the present embodiment is 4.5. Thus, when the current flowing in the semiconductor device according to the present embodiment is equal to or larger 4.25 times than the conventional semiconductor device, the parasitic bipolar transistor in the semiconductor device according to the present embodiment functions. Thus, the avalanche resistance in the semiconductor device according to the present embodiment is larger 4 times than the conventional semiconductor device.

Third Embodiment

Figure 7:
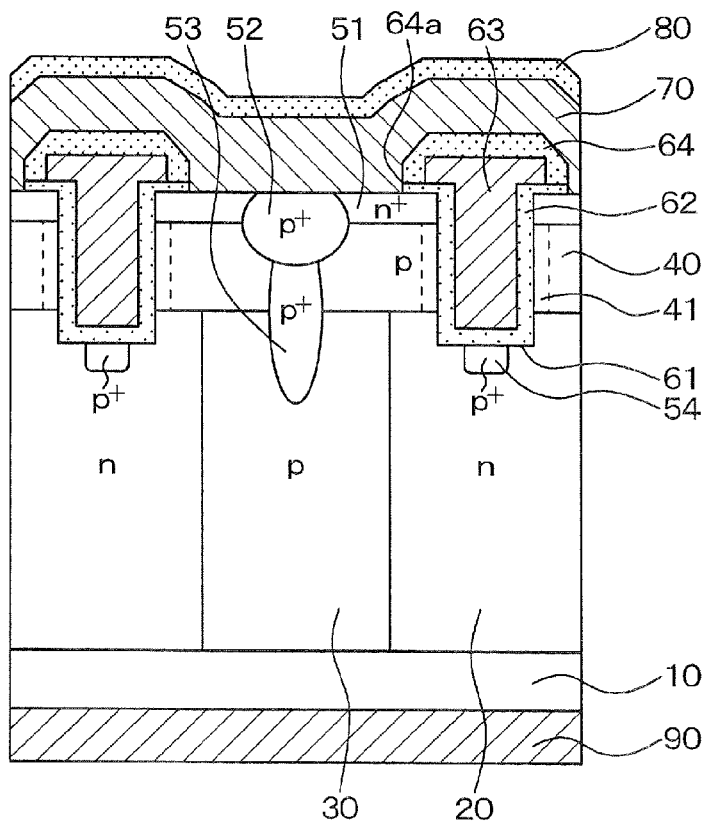
FIG. 7 is a diagram showing a cross sectional view of a semiconductor device according to a third embodiment.

In a semiconductor device according to the present embodiment, an electric field relaxation layer is formed under the trench 61. FIG. 7 shows the semiconductor device according to the present embodiment.

As shown in FIG. 7, in the semiconductor device according to the present embodiment, the electric field relaxation layer 54 having the $P^+$ conductive type is formed under the trench 61. In the present embodiment, the width of the electric field relaxation layer 54 is narrower than the trench 61.

In the semiconductor device, the electric field relaxation layer 54 is formed under the trench 61, so that the electric field concentration under the trench 61 is restricted. Thus, the occurrence of the breakdown under the trench 61 is much restricted. Specifically, the breakdown easily occurs under the embedded $P^+$ conductive type region 53. Accordingly, compared with the second embodiment, the damage or the destroy of the gate insulation film 62 is much restricted. Further, the effects similar to the second embodiment are obtained.

In the present embodiment, the width of the electric field relaxation layer 54 is narrower than the trench 61. Accordingly, the current path in the P conductive channel layer 40 from the inversion layer 41 to the N column 20 in case of the on-state is restricted from being blocked by the electric field relaxation layer 54, compared with a case where the electric field relaxation layer 54 is wider than the trench 61, i.e., the electric field relaxation layer 54 is formed around a part of the trench 61, which reaches the N column 20. Thus, the increase of the on-state resistance is restricted.

Here, the semiconductor device according to the present embodiment is manufactured such that the P conductive type impurity same as the embedded $P^+$ conductive type region 53 is implanted into the N column 20 simultaneously in the step shown in FIG. 3E, and the thermal treatment is executed, so that the embedded $P^+$ conductive type region 53 and the electric field relaxation layer 54 are formed. After that, the trench 61 is formed in the step shown in FIG. 3G such that the trench 61 does not penetrate the electric field relaxation layer 54.

When the embedded $P^+$ conductive type region 53 is formed, the electric field relaxation layer 54 is also formed at the same time. Accordingly, even when the electric field relaxation layer 54 is formed, the manufacturing process is not increased. Further, in the manufacturing method, the electric field relaxation layer 54 is formed in the step, which is independent from the step for forming the trench 61. Thus, the width of the electric field relaxation layer 54 can be controlled sufficiently.

Fourth Embodiment

Figure 8:
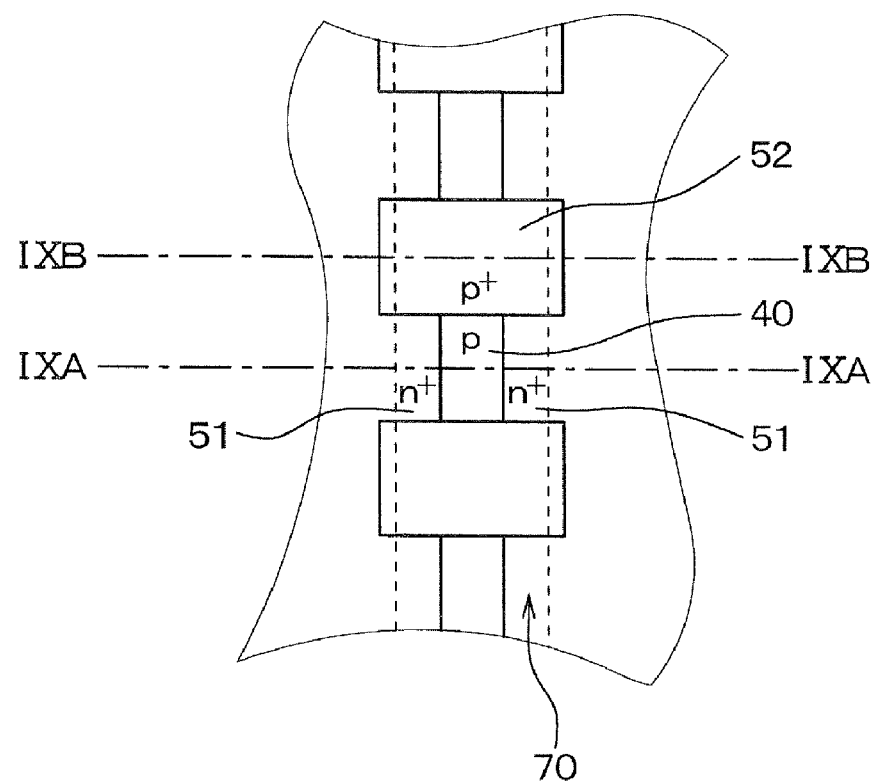
FIG. 8 is a diagram showing a cross sectional view of a semiconductor device according to a fourth embodiment.
Figure 9A:
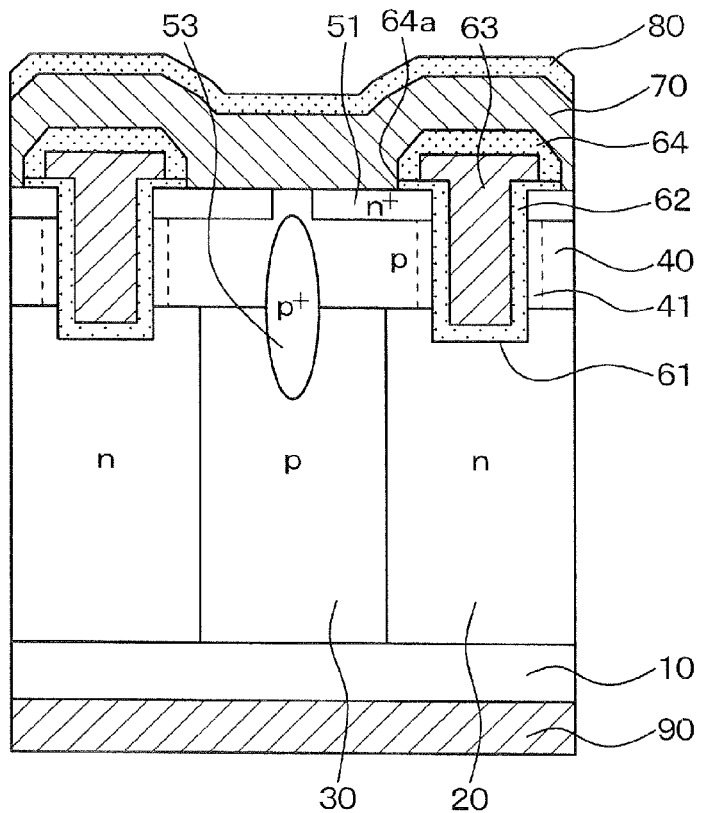
FIG. 9A is a diagram showing a cross sectional view of the device taken along line IXA-IXA in FIG. 8.
Figure 9B:
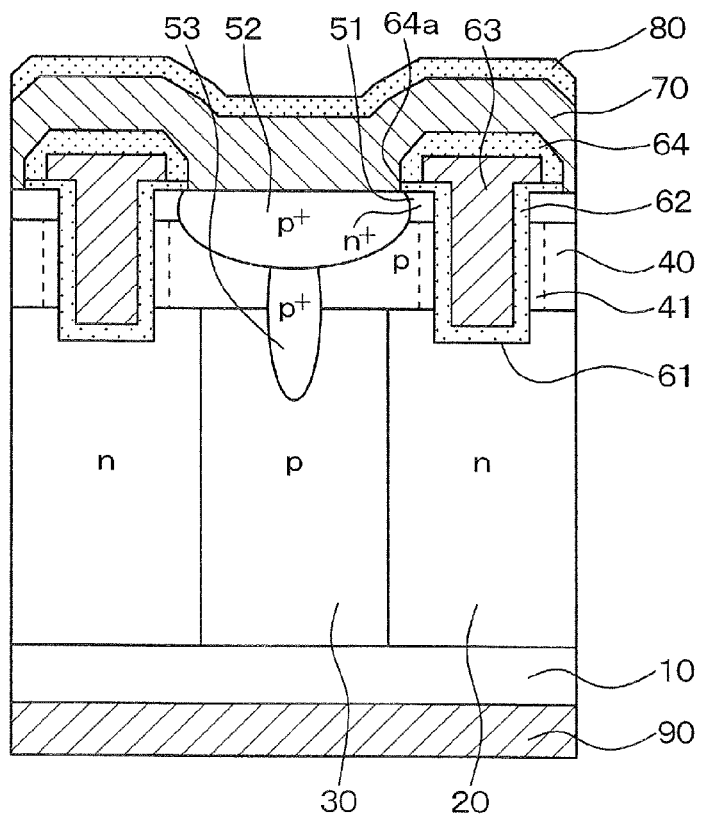
FIG. 9B is a diagram showing a cross sectional view of the device taken along line IXB-IXB in FIG. 8.

In a semiconductor device according to the present embodiment, multiple contact $P^+$ conductive type regions 52 are formed in the longitudinal direction of the P column 30. The contact $P^+$ conductive type regions 52 are separated from each other. FIG. 8 shows a plan view of the semiconductor device. FIG. 9A shows a cross sectional view of the device taken along line IXA-IXA in FIG. 8, and FIG. 9B shows a cross sectional view of the device taken along line IXB-IXB in FIG. 8. In FIG. 8, the source electrode 70 is shown as a dotted line.

As shown in FIGS. 8, 9A and 9B, in the semiconductor device according to the present embodiment, the contact P+ conductive type regions 52 are formed in the longitudinal direction of the P column 30 to be separated from each other. At a part of the P column 30, on which the contact P+ conductive type regions 52 are not formed, a distance between the N+ conductive type source regions 51 adjacent to the part of the P column 30 is short. FIG. 9A shows the cross section of the part of the P column 30, on which the contact P+ conductive type regions 52 are not formed. In the cross section shown in FIG. 9A, the source electrode 70 is electrically coupled with the N+ conductive type source region 51. FIG. 9B shows the cross section of the other part of the P column 30, on which the contact P+ conductive type regions 52 are formed. In the cross section shown in FIG. 9B, the source electrode 70 is electrically coupled with the contact P+ conductive type regions 52. In the present embodiment, the source electrode 70 connects to the N+ conductive type source region 51 and the contact P+ conductive type regions 52 alternately along with the longitudinal direction of the N column 20 and the P column 30.

In the semiconductor device, as described in the first embodiment, the N+ conductive type source region 51 and the contact P+ conductive type regions 52 extend along with the longitudinal direction of the N column 20 and the P column 30, respectively, and the N+ conductive type source region 51 and the contact P+ conductive type regions 52 are electrically coupled with the source electrode 70 in the cross section of the perpendicular direction and the cross section of the longitudinal direction. Comparing with the semiconductor device according to the first embodiment, the distance between adjacent trenches 61 is short, so that the integration of the semiconductor device according to the present embodiment is improved. Thus, the effects similar to the second embodiment are obtained.

Fifth Embodiment

Figure 10:
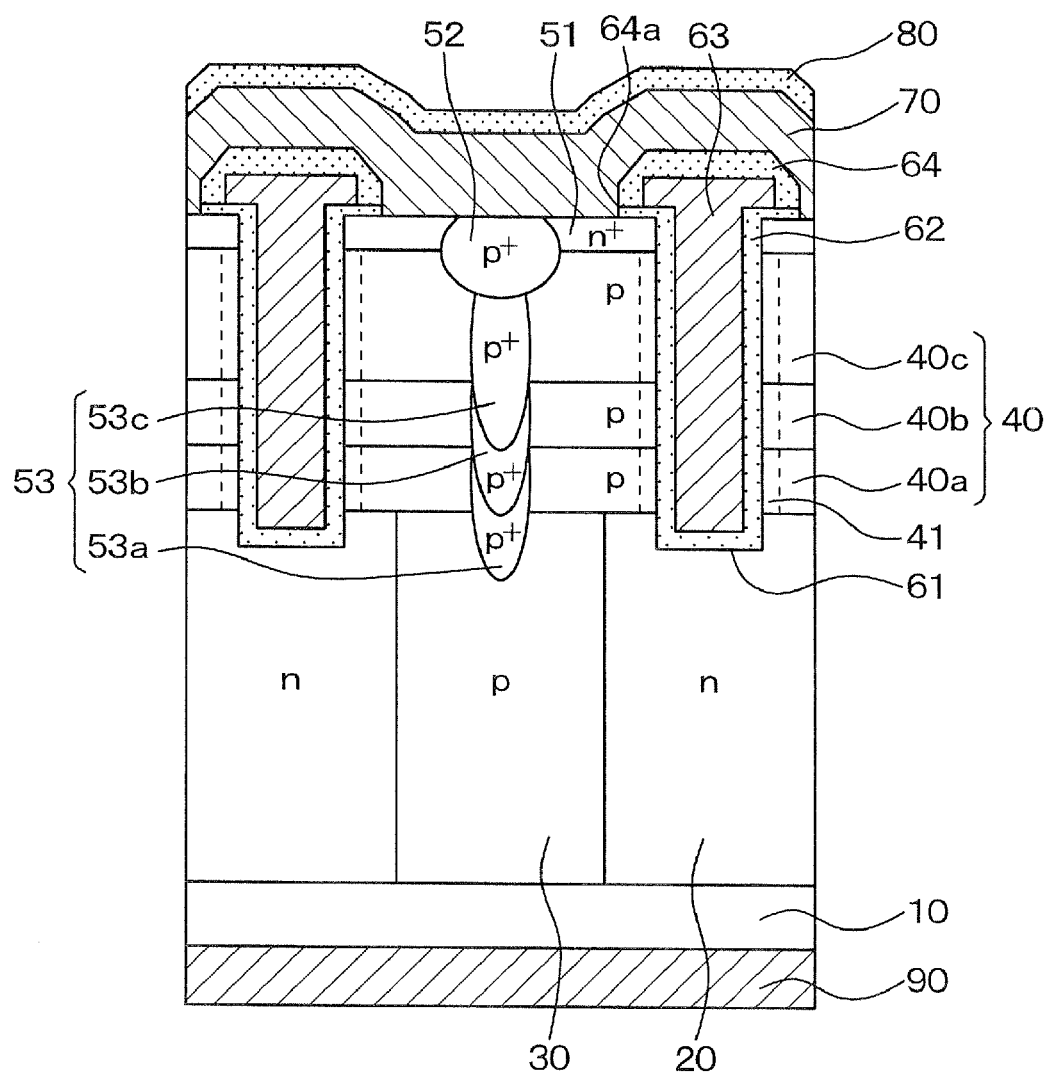
FIG. 10 is a diagram showing a cross sectional view of a semiconductor device according to a fifth embodiment.

In a semiconductor device according to the present embodiment, the depth of the N conductive type channel layer 40 is larger than the device according to the second embodiment. FIG. 10 shows the semiconductor device according to the present embodiment.

As shown in FIG. 10, in the semiconductor device according to the present embodiment, the P conductive type channel layer 40 is deep, i.e., thick. Specifically, the P conductive type channel layer 40 includes first to third channel forming layers 40a-40c, which are stacked in this order. The embedded P+ conductive type region 53 includes first to third embedded P+ conductive type region forming layers 53a-53c, which are connected to each other in the depth direction. In the present embodiment, the first embedded P+ conductive type region forming layer 53a has the maximum impurity concentration in the P column 30. The depth direction is a normal direction of the surface of the N+ conductive type substrate 10.

The semiconductor device is manufactured as follows. Specifically, the step shown in FIG. 3E is performed, and the P conductive type impurity for providing the first embedded P+ conductive type region forming layer 53a is implanted in the P column 30. Then, the step shown in FIG. 3F is performed, so that the first channel forming layer 40a is formed. Then, the step shown in FIG. 3E is performed, so that the P conductive type impurity for providing the second embedded P+ conductive type region forming layer 53b is implanted in the first channel forming layer 40a. Then, the step shown in FIG. 3F is performed again, so that the second channel forming layer 40a is formed. Then, the step shown in FIG. 3E is performed again, so that the P conductive type impurity for providing the third embedded P+ conductive type region forming layer 53c is implanted in the second channel forming layer 40b. Then, the step shown in FIG. 3F is performed again, so that the third channel forming layer 40c is formed. Then, the step shown in FIG. 3G is performed, so that the thermal treatment is executed. Thus, the P conductive type impurity is diffused so that the first and second embedded P+ conductive type region forming layers 53a, 53b are connected to each other, and the second and third embedded P+ conductive type region forming layers 53b, 53c are connected to each other. Thus, the semiconductor device shown in FIG. 10 is completed.

Comparing with the device according to the second embodiment, since the P conductive type channel layer 40 is thick in the semiconductor device according to the present embodiment, the breakdown voltage is improved, and further, the effects similar to the second embodiment are obtained. Further, since the first to third embedded P+ conductive type region forming layers 53a-53c are connected to each other in the depth direction so that the embedded P+ conductive type region 53 is formed, the thermal processing temperature is low, and the thermal processing time is short, compared with a case where the P conductive type impurity is implanted in the P conductive type channel layer 40, and the thermal treatment is performed in order to diffuse the P conductive type impurity so that the embedded P+ conductive type region 53 is formed to reach the P column 30.

Sixth Embodiment

Figure 11:
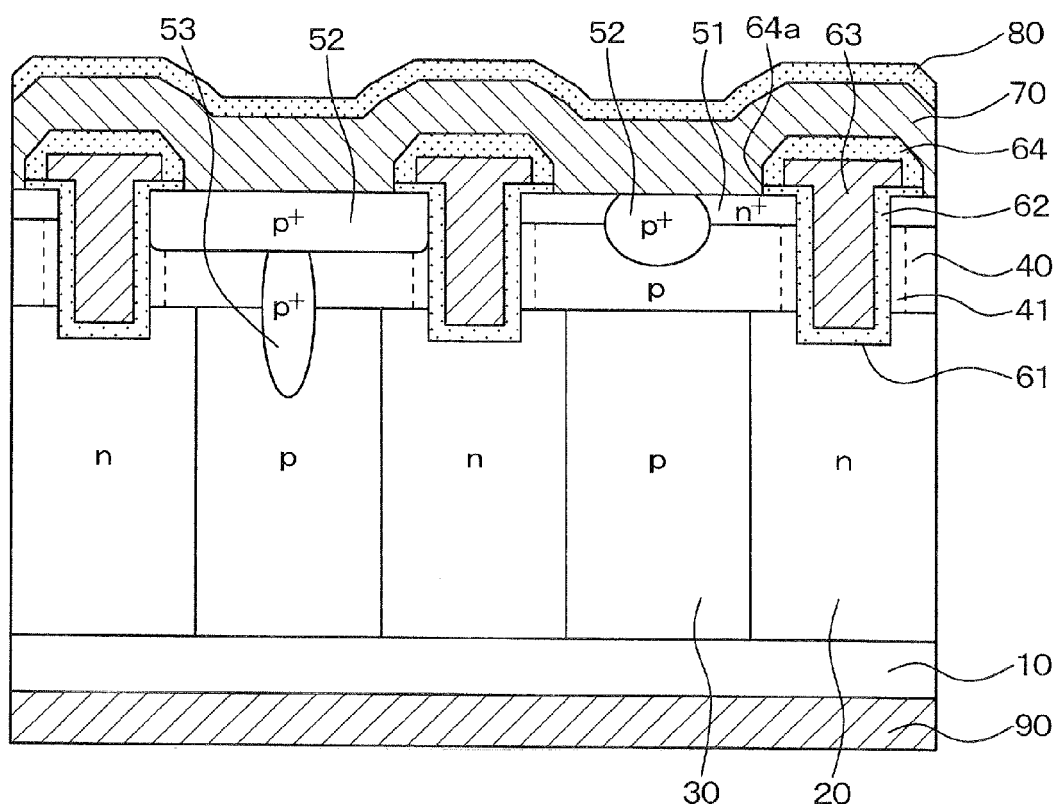
FIG. 11 is a diagram showing a cross sectional view of a semiconductor device according to a sixth embodiment.

In a semiconductor device according to the present embodiment, the N+ conductive type source region 51 is not formed in a surface portion of the P conductive type channel layer 40 over the embedded P+ conductive type region 53 between adjacent trenches 61. FIG. 11 shows the semiconductor device according to the present embodiment.

As shown in FIG. 11, in the semiconductor device according to the present embodiment, the embedded P+ conductive type region 53 and the contact P+ conductive type region 52 are formed between adjacent trenches 61. The contact P+ conductive type region 52 and the N+ conductive type source region 51 are formed between other adjacent trenches 61. Specifically, the N+ conductive type source region 51 is not formed in a portion between adjacent trenches 61, in which the embedded P+ conductive type region 53 is formed. Thus, the embedded P+ conductive type region 53 is formed in certain P columns 30, not in all P columns 30, compared with the semiconductor device according to the second embodiment. For example, the embedded P+ conductive type region 53 is formed alternately in the P columns 30. The contact P+ conductive type region 52 disposed on the embedded P+ conductive type region 53 contacts the adjacent trenches 61.

In the semiconductor device, the N+ conductive type source region 51 is not formed in the portion between adjacent trenches 61, in which the embedded P+ conductive type region 53 is formed. Thus, the parasitic transistor is not formed around the embedded P+ conductive type region 53. Accordingly, when the avalanche current flows from the embedded P+ conductive type region 53 to the contact P+ conductive type region 52, the avalanche current is restricted from flowing into the N+ conductive type source region 51. Further, the effects similar to the second embodiment are obtained.

Seventh Embodiment

Figure 12A:
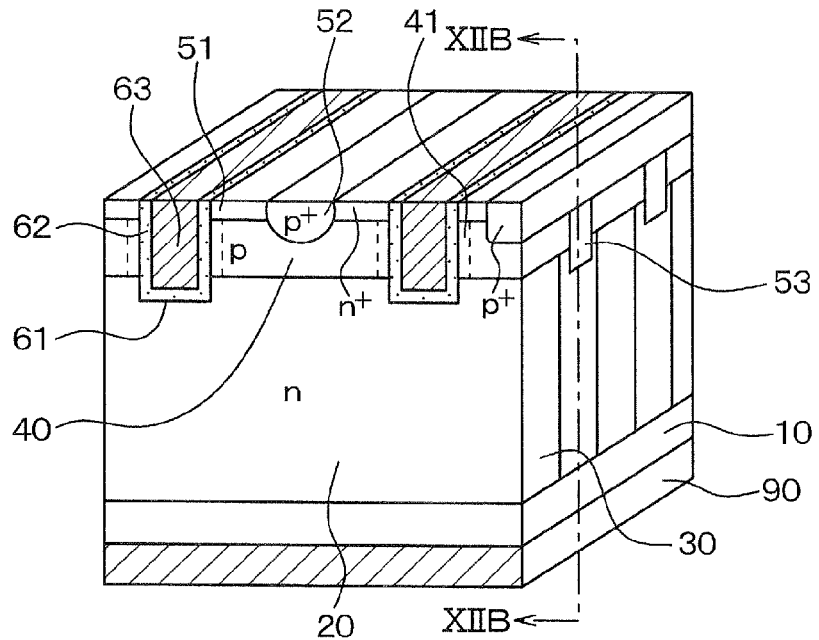
FIG. 12A a diagram showing a perspective view of a semiconductor device according to a seventh embodiment.
Figure 12B:
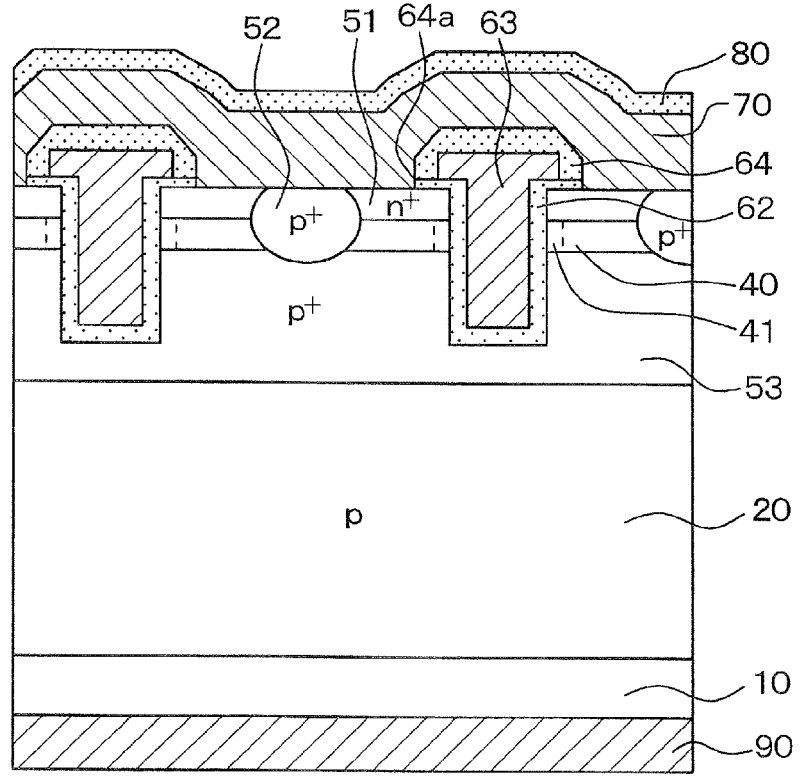
FIG. 12B is a diagram showing a cross sectional view of the device taken along line XIIB-XIIB in FIG. 12A.

In a semiconductor device according to the present embodiment, the trench 61, the N+ conductive type source region 51 and the contact P+ conductive type region 52 extend in the direction perpendicular to the longitudinal direction of the N column 20 and the P column 30. FIG. 12A shows the semiconductor device according to the present embodiment, and FIG. 12B shows the cross sectional view of the device taken along line XIIB-XIIB in FIG. 12A. Here, the source electrode 70 and the protection film 80 are not shown in FIG. 12A.

In the semiconductor device according to the present embodiment, the trench 61, the N+ conductive type source region 51 and the contact P+ conductive type region 52 extend in the direction perpendicular to the longitudinal direction of the N column 20 and the P column 30. Specifically, the trench 61, the N+ conductive type source region 51 and the contact P+ conductive type region 52 have the longitudinal direction, which is perpendicular to the longitudinal direction of the embedded P+ conductive type region 53. The embedded P+ conductive type region 53 contacting the trench 61 is disposed at a cross section between the trench 61 and the embedded P+ conductive type region 53.

In the semiconductor device, since the contact P+ conductive type region 52 extends in the direction perpendicular to the longitudinal direction of the embedded P+ conductive type region 53, the contact P+ conductive type region 52 surely contacts the embedded P+ conductive type region 53, compared with a case where the contact P+ conductive type region 52 extends along with the longitudinal direction of the embedded P+ conductive type region 53. Specifically, a deviation of alignment between the contact P+ conductive type region 52 and the embedded P+ conductive type region 53 is minimized, and further, the effects similar to the second embodiment are obtained.

Eighth Embodiment

Figure 13A:
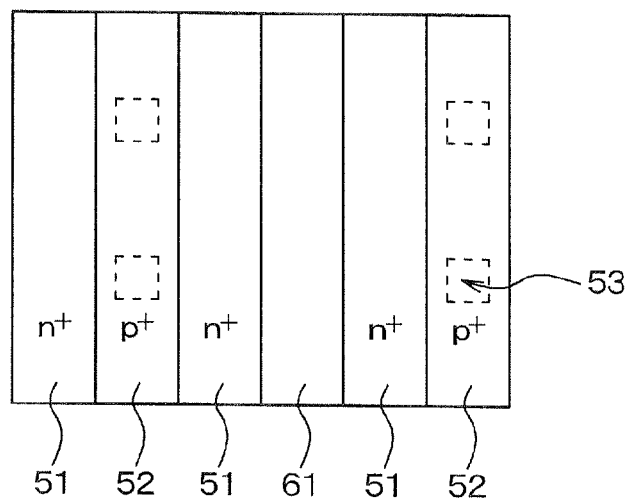
FIG. 13A is a diagram showing a plan view of a semiconductor device according to an eighth embodiment.
Figure 13B:
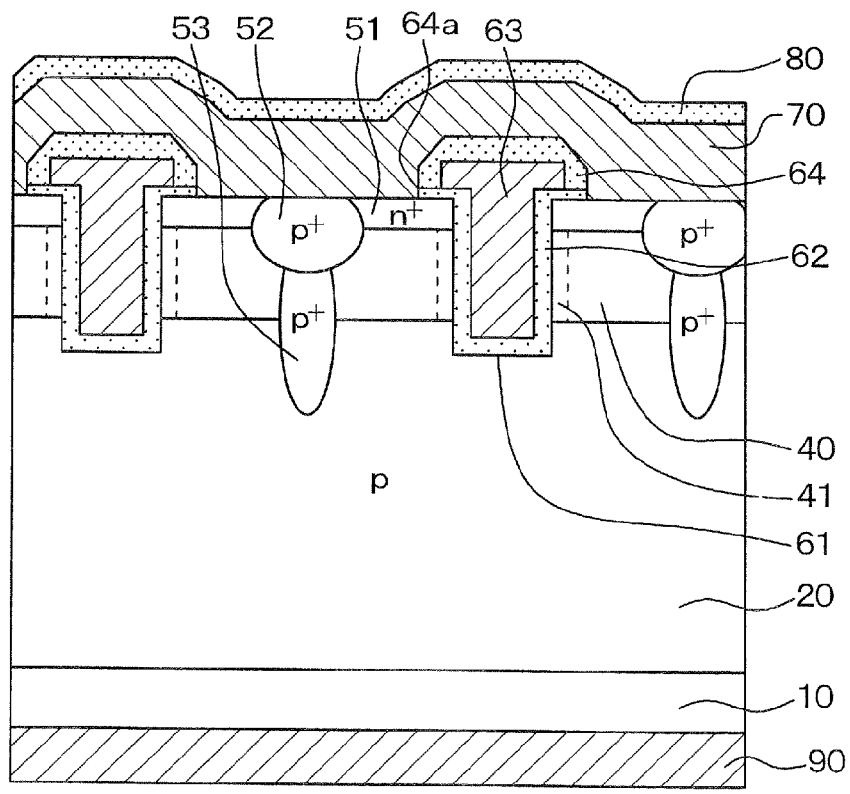
FIG. 13B is a diagram showing a cross sectional view of the device in FIG. 13A.

In a semiconductor device according to the present embodiment, the embedded P+ conductive type region 53 is arranged only under the contact P+ conductive type region 52. A perspective view of the semiconductor device according to the present embodiment is similar to the view shown in FIG. 12A. FIG. 13A shows a plan view of the device, and FIG. 13B shows a cross sectional view of the device. Here, FIG. 13B corresponds to the cross sectional view of the device taken along line XIIB-XIIB in FIG. 12A.

As shown in FIGS. 12A and 13A-13B, in the semiconductor device according to the present embodiment, multiple embedded P+ conductive type regions 53 are formed along with the longitudinal direction of the P column 30. The embedded P+ conductive type regions 53 are separated from each other. Further, the embedded P+ conductive type regions 53 are formed only under the contact P+ conductive type region 52. The embedded P+ conductive type regions 53 contacting the trench 61 is not formed in the P conductive type channel layer 40.

Comparing with the device according to the seventh embodiment, in the semiconductor device according to the present embodiment, since the embedded P+ conductive type regions 53 contacting the trench 61 is not formed in the P conductive type channel layer 40, the current path from the P conductive type channel layer 40 to the N column 20 is restricted from being blocked by the embedded P+ conductive type region 53. Thus, the increase of the on-state resistance is restricted. Further, the effects similar to the seventh embodiment are obtained.

Ninth Embodiment

Figure 14:
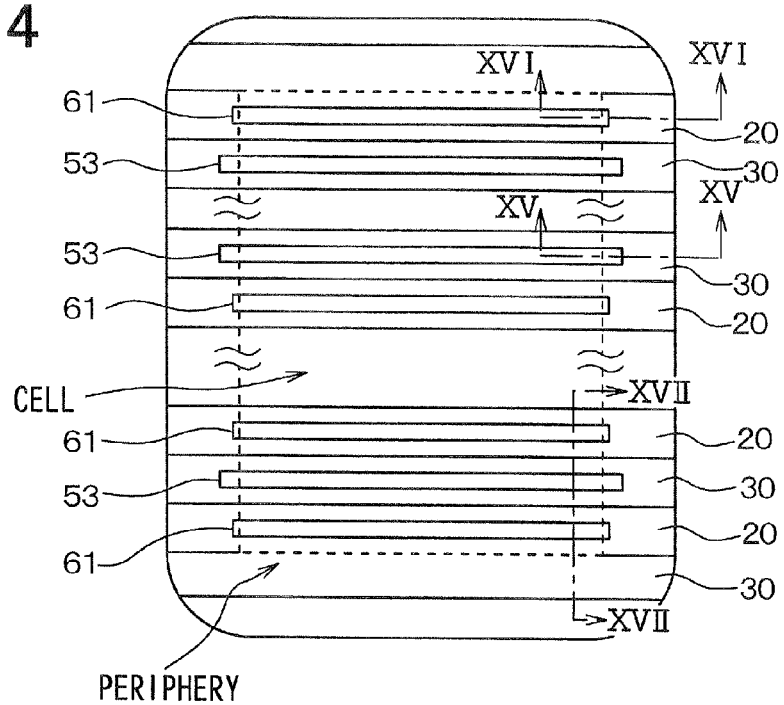
FIG. 14 is a diagram showing a plan view of a semiconductor device according to a ninth embodiment.
Figure 15:
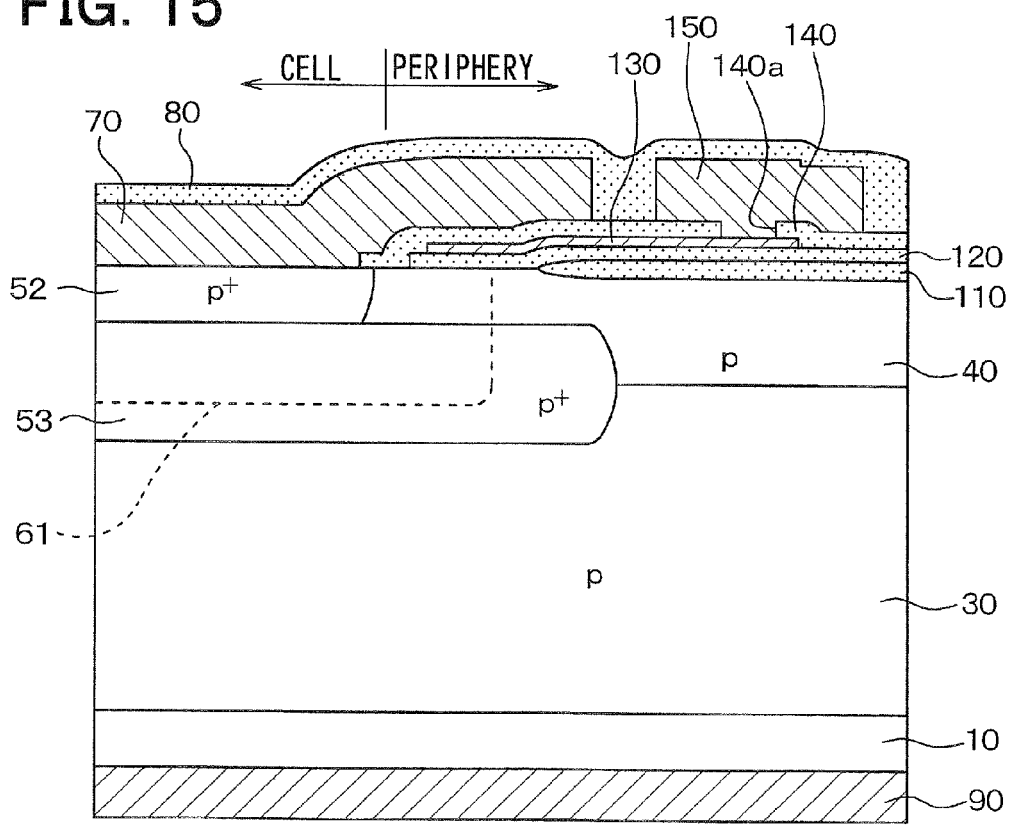
FIG. 15 is a diagram showing a cross sectional view of the device taken along line XV-XV in FIG. 14.
Figure 16:
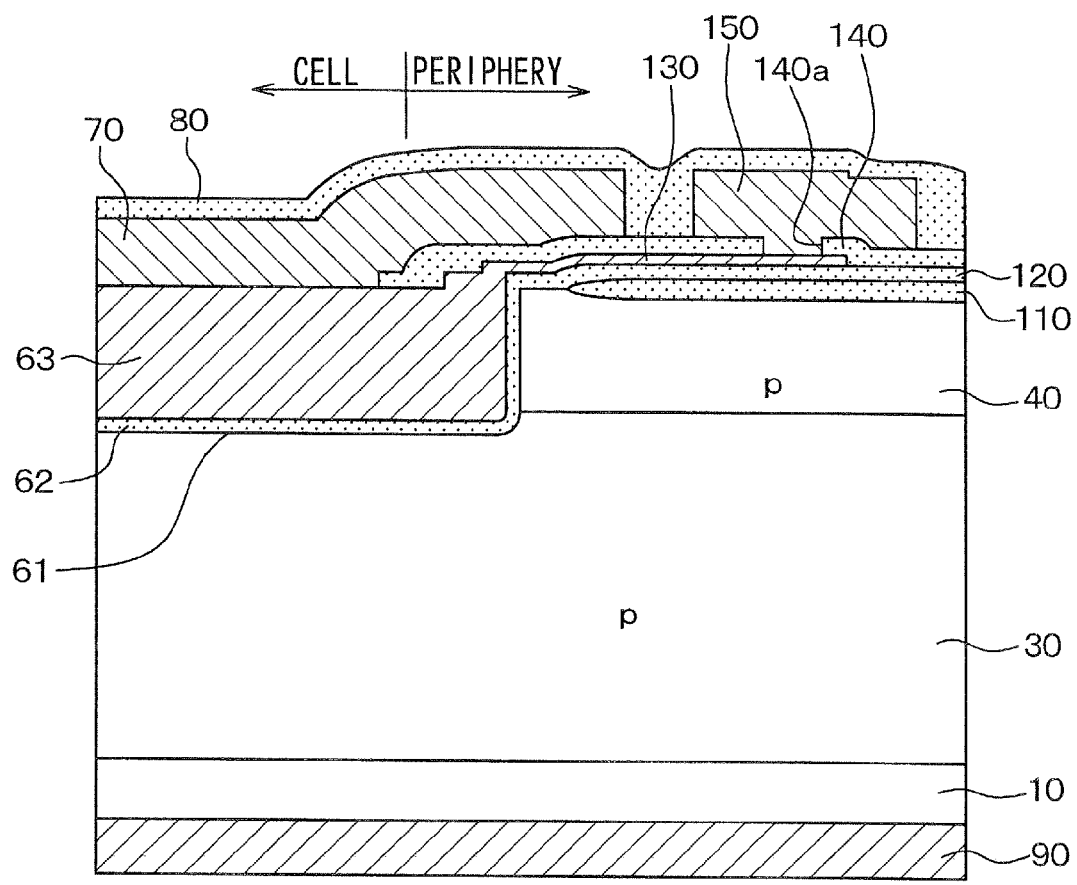
FIG. 16 is a diagram showing a cross sectional view of the device taken along line XVI-XVI in FIG. 14.
Figure 17:
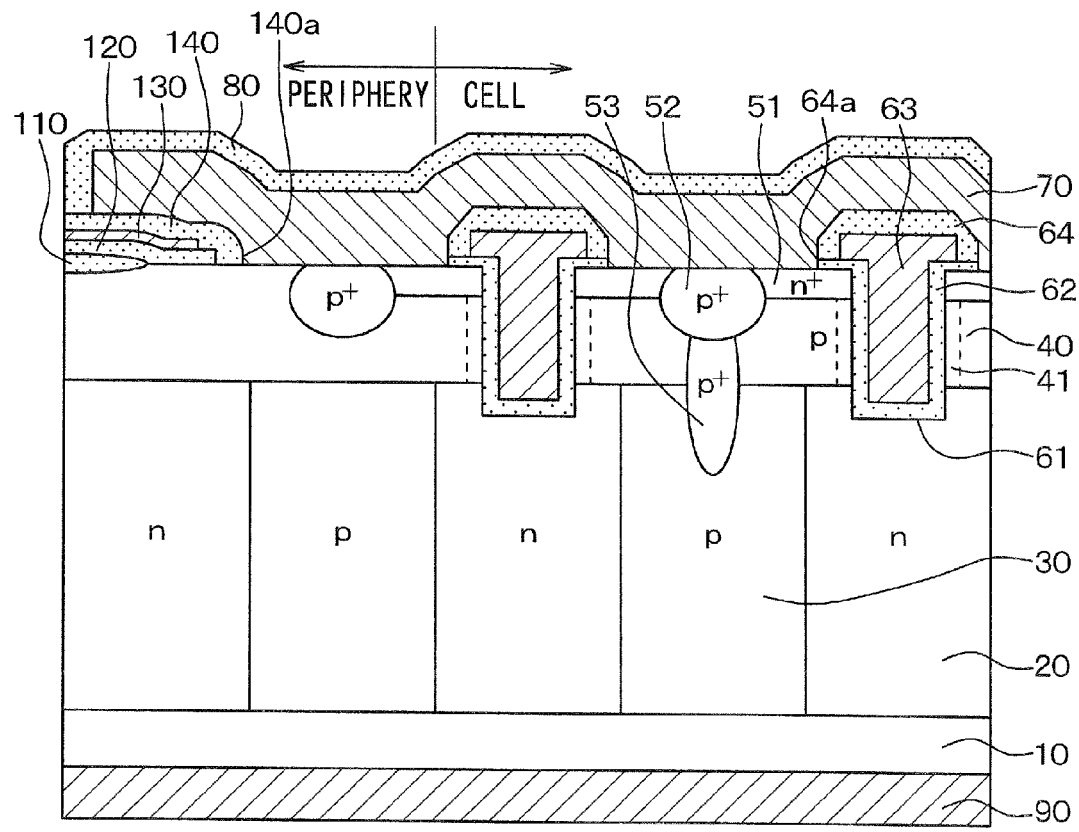
FIG. 17 is a diagram showing a cross sectional view of the device taken along line XVII-XVII in FIG. 14.

A semiconductor device according to the present embodiment includes an outer periphery portion at an edge of the device. FIG. 14 shows a plan view of the trench 61 and the embedded P+ conductive type region 53 in the semiconductor device. FIG. 15 shows the cross sectional view of the device taken along line XV-XV in FIG. 14, FIG. 16 shows the cross sectional view of the device taken along line XVI-XVI in FIG. 14, and FIG. 17 shows the cross sectional view of the device taken along line XVII-XVII in FIG. 14.

As shown in FIGS. 14 to 17, the semiconductor device according to the present embodiment includes a cell portion and an outer periphery portion. The cell portion includes the trench gate structure, the N+ conductive type source region 51, the contact P+ conductive type region 52 and the embedded P+ conductive type region 53. The outer periphery portion is disposed at an outer edge of the cell portion.

Each trench 61 extends from the cell portion to the outer periphery portion beyond the boundary between the cell portion and the outer periphery portion. The contact P+ conductive type region 52 is formed in the P conductive type channel layer 40 in the cell portion. The N+ conductive type source region 51 is also formed in the P conductive type channel layer 40 in the cell portion. Specifically, the N+ conductive type source region 51 and the contact P+ conductive type region 52 have ends, which are disposed inside of an end of the trench 61.

Each embedded P+ conductive type region 53 extends from the cell portion to the outer periphery portion beyond the boundary between the cell portion and the outer periphery portion. Each embedded P+ conductive type region 53 has an end, which is disposed outside of an end of the trench 61. The embedded P+ conductive type regions 53 are not connected to each other in the outer periphery portion.

In the outer periphery portion, a LOCOS oxide film 110 is formed on a surface of the P conductive type channel layer 40. An insulation film 120 such as an oxide film covers the LOCOS oxide film 110. A gate wiring 130 is retrieved from the gate electrode 63, and disposed on the insulation film 120. Another insulation film 140 such as an oxide film is formed to cover the gate wiring 130. A wiring layer 150 is formed on the insulation film 140. The wiring layer 150 is electrically coupled with the gate wiring 130 via a contact hole 140a, which is formed in the insulation film 140.

The embedded P+ conductive type region 53 extending from the cell portion to the outer periphery portion is disposed in the outer periphery portion. The embedded P+ conductive type region 53 extending in the longitudinal direction of the trench 61 is not formed in the outer periphery portion. Specifically, the embedded P+ conductive type region 53 is not formed in the P column 30, which is arranged only in the outer periphery portion.

In the semiconductor device, each embedded P+ conductive type region 53 terminates at a position outside of the end of the trench 61. Accordingly, the electric field concentration on the bottom of the trench 61 at the end of the trench in the longitudinal direction is restricted from occurring, compared with a case where the embedded P+ conductive type region 53 terminates at a position inside of the end of the trench 61.

Further, the embedded P+ conductive type region 53 is not formed in the P column 30, which is disposed only in the outer periphery portion. Thus, the breakdown voltage at the outer periphery portion is high, compared with a case where the embedded P+ conductive type region 53 is formed in the P column 30, which is disposed only in the outer periphery portion. Thus, the breakdown easily occurs in the cell portion, and therefore, the avalanche current is absorbed in a whole of the cell portion. The effects similar to the second embodiment are obtained.

Tenth Embodiment

Figure 18:
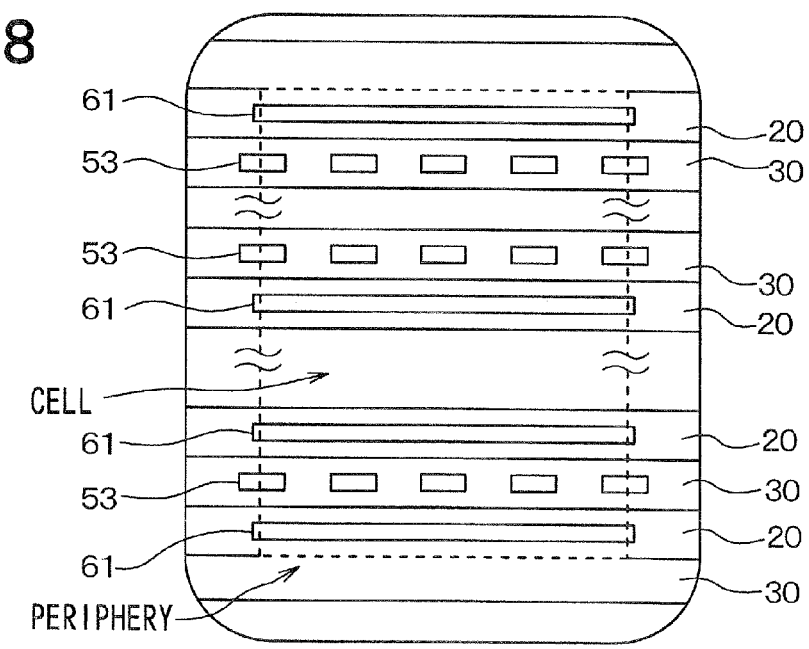
FIG. 18 is a diagram showing a plan view of a semiconductor device according to a tenth embodiment.

In a semiconductor device according to the present embodiment, multiple embedded P+ conductive type regions 53 are formed along with the longitudinal direction of the P column 30 to be separated from each other. FIG. 18 shows a plan view of the trench 61 and the embedded P+ conductive type regions 53 in the semiconductor device according to the present embodiment.

As shown in FIG. 18, in the semiconductor device according to the present embodiment, multiple embedded P+ conductive type regions 53 are formed along with the longitudinal direction of the P column 30 to be separated from each other. Thus, the embedded P+ conductive type regions 53 are partially removed, i.e., partially arranged, so that the current path at a part, in which the embedded P+ conductive type regions 53 are not formed, is not narrowed by the embedded P+ conductive type regions 53. Although the breakdown voltage is not reduced, the on-state resistance is reduced.

Eleventh Embodiment

A manufacturing method of a semiconductor device according to the present embodiment is different from that according to the first embodiment. FIGS. 19A to 19F show the manufacturing method of the semiconductor device according to the present embodiment.

Figure 19A:
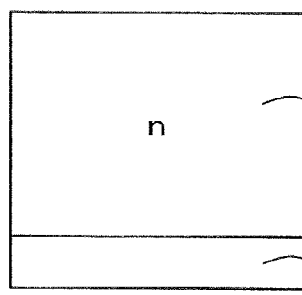
FIGS. 19A to 19F are diagrams showing a manufacturing method of a semiconductor device according to a eleventh embodiment.
Figure 19B:
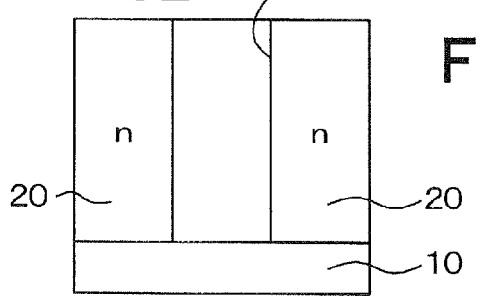
Figure 19C:
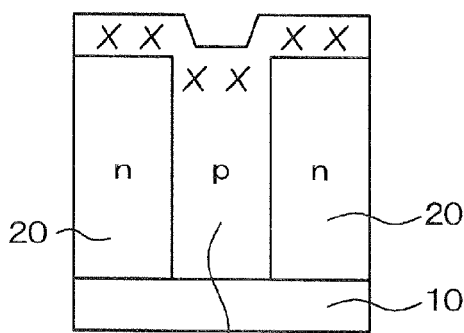

First, as shown in FIGS. 19A and 19B, similar to the steps in FIGS. 3A and 3B, the N+ conductive type substrate 10 is prepared, and the N conductive type region 20 is epitaxially grown on the substrate 10. Then, the trench 100 is formed on the N conductive type region 20 by a dry etching method such as a RIE method such that the trench 100 reaches the substrate 10. Then, as shown in FIG. 19C, the P conductive type region 30 is embedded in and epitaxially grown in the trench 100, and the P conductive type region 30 is arranged on the N column 20. Successively, with using the P conductive type region 30 as a mask on the N column 20, the P conductive type impurity is implanted in the P conductive type region 30 embedded in the trench 100.

Figure 19D:
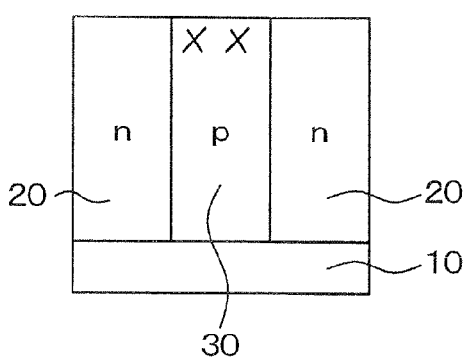
Figure 19E:
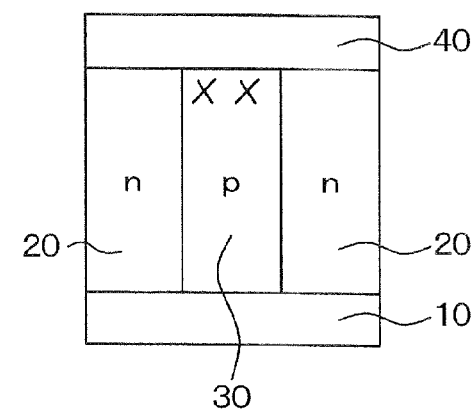
Figure 19F:
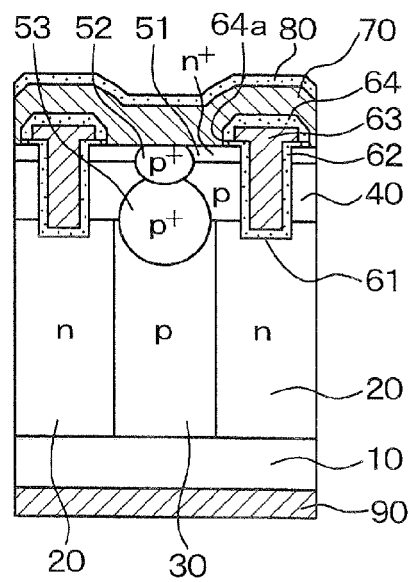

Then, as shown in FIG. 19D, the surface is polished by a CMP method. Then, as shown in FIGS. 19E and 19F, similar to the steps in FIGS. 3F and 3G, the semiconductor device in FIG. 1 is formed.

In the manufacturing method of the semiconductor device, when the P conductive type region 30 is embedded in the trench 100, the P conductive type region 30 is arranged on the N conductive type region 20, and the P conductive type impurity is implanted in the P conductive type region 30 embedded in the trench 100 with using the P conductive type region 30 on the N conductive type region 20 as a mask. Accordingly, when the P conductive type impurity is implanted, it is not necessary to prepare an additional mask. Therefore, the manufacturing method is simplified.

Twelfth Embodiment

Figure 20:
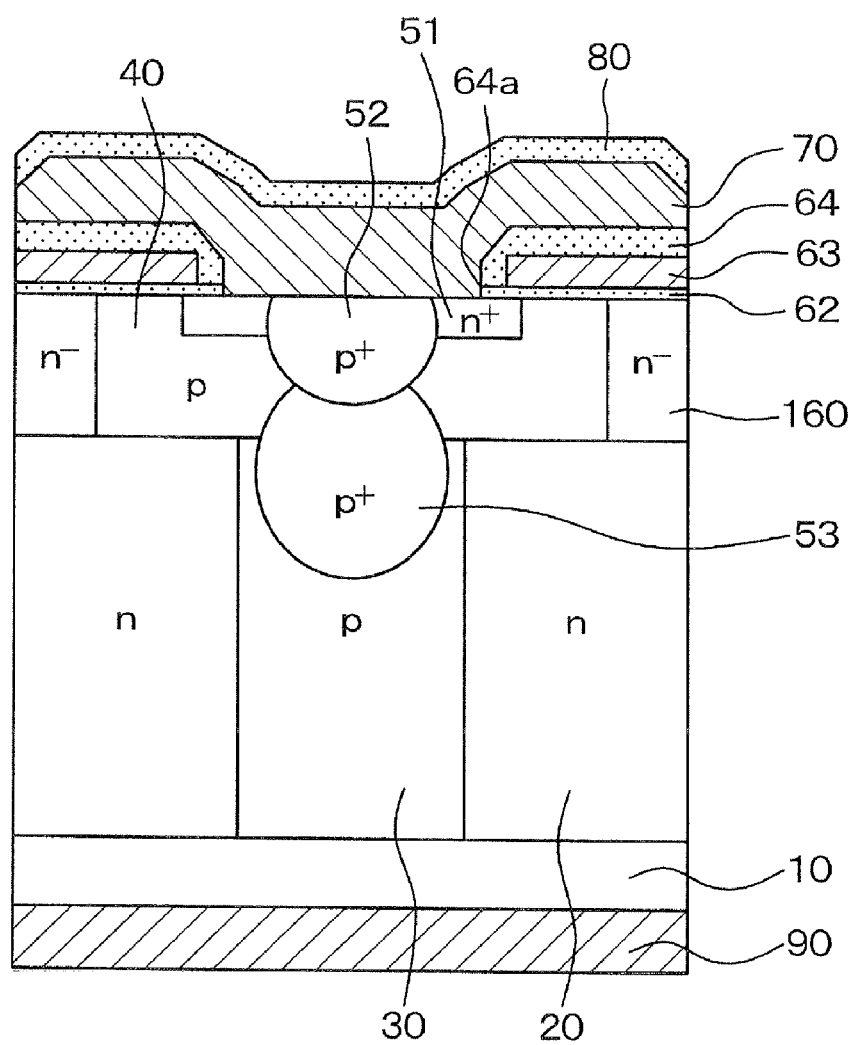
FIG. 20 is a diagram showing a cross sectional view of a semiconductor device according to a twelfth embodiment.

A semiconductor device according to the present embodiment is a planar type semiconductor device. FIG. 20 shows a cross sectional view of the semiconductor device according to the present embodiment.

As shown in FIG. 20, in the semiconductor device according to the present embodiment, the N− conductive type drift layer 160 is formed on the super junction structure. The P conductive type channel layer 40 having a predetermined depth is formed in a region of the N− conductive type drift layer 160 including the P column 30. In the present embodiment, the P conductive type channel layer 40 has a depth equal to the N− conductive type drift layer 160. Alternatively, the P conductive type channel layer 40 may be shallower than the N− conductive type drift layer 160.

Multiple N+ conductive type source regions 51 are formed in a surface portion of the P conductive type channel layer 40. The N+ conductive type source regions 51 are separated from each other, and have a depth shallower than the P conductive type channel layer 40. Further, the contact P+ conductive type region 52 is formed in a surface portion of the P conductive type channel layer 40, which is opposite to the P column 30, and different from a region in which the N+ conductive type source region 51 is formed. Specifically, the contact P+ conductive type region 52 is sandwiched between the N+ conductive type source regions 51.

Further, the gate insulation film 62 is formed on the surface of the P conductive channel layer 40 and on the surface of the N− conductive type drift layer 160. Specifically, in the present embodiment, a surface region of the P conductive type channel layer 40 opposite to the N column 20, in which the contact P+ conductive type region 52 and the N+ conductive type source region 51 are not formed, provides a surface of the channel. The gate electrode 63 is formed on the gate insulation film 62. The gate electrode 63 is covered with the interlayer insulation film 64. The source electrode 70 is formed on the interlayer insulation film 64. The source electrode 70 is electrically coupled with the contact P+ conductive type region 52 and the N+ conductive type source region 51 via a contact hole 64a, which is formed in the interlayer insulation film 64.

Similar to the first embodiment, the cross section of the embedded P+ conductive type region 53 has a shape with an equivalent concentration line curved with a predetermined curvature. The outline of the embedded P+ conductive type region 53 has a shape with a curvature so that the outline of the embedded P+ conductive type region 53 is curved. Specifically, the cross section of the embedded P+ conductive type region 53 has an ellipsoidal shape (oval or egg shape). The maximum width of the embedded P+ conductive type region 53 in a direction perpendicular to the extending direction is narrower than the P column 30. The maximum length of the P+ conductive type region 53 in a direction perpendicular to the substrate 10 is larger than the contact P+ conductive type region 52. The embedded P+ conductive type region 53 is arranged in the P conductive channel layer 40 and the P column 30. Further, the embedded P+ conductive type region 53 has the impurity concentration higher than the P conductive channel layer 40. The embedded P+ conductive type region 53 has the maximum impurity concentration at a position in the P column 30.

Even when the semiconductor device is a planar type device, the embedded P+ conductive type region 53 has the maximum impurity concentration at a position in the P column 30. Therefore, the effects similar to the first embodiment are obtained. When the semiconductor device is a planar type device, the embedded P+ conductive type region 53 has the maximum impurity concentration at a position in the P column 30, and the cross section of the embedded P+ conductive type region 53 has the ellipsoidal shape with a predetermined curvature. The maximum electric field concentration occurs near a boundary between the embedded P+ conductive type region 53 and the P conductive channel layer 40. Thus, the breakdown occurs at the boundary between the embedded P+ conductive type region 53 and the P conductive channel layer 40. Thus, the leak current is reduced since the avalanche current path is narrowed, and therefore, the operation resistance is reduced.

The semiconductor device according to the present embodiment is manufactured by a method similar to the method in FIGS. 3A to 3G. Specifically, in the step in FIG. 3G, a predetermined semiconductor process is performed so that the device is formed.

Other Embodiments

Figure 21:
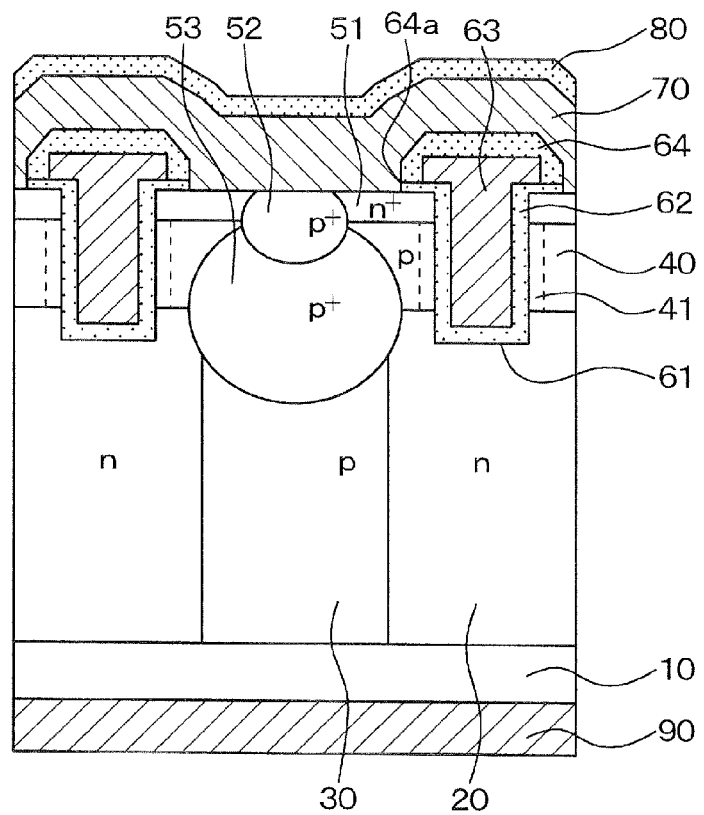
FIG. 21 is a diagram showing a cross sectional view of a semiconductor device according to other embodiments.

In the above embodiments, the embedded P+ conductive type region 53 is narrower than the P column 30. Alternatively, the device may have the following feature. FIG. 21 shows a semiconductor device according to the other embodiments. As shown in FIG. 21, the embedded P+ conductive type region 53 is wider than the P column 30. Further, the embedded P+ conductive type region 53 may protrude into the N column 20. In this case, the width of the embedded P+ conductive type region 53 is preferably set to be separated from the inversion layer 41 in order to secure the current path.

Figure 22:
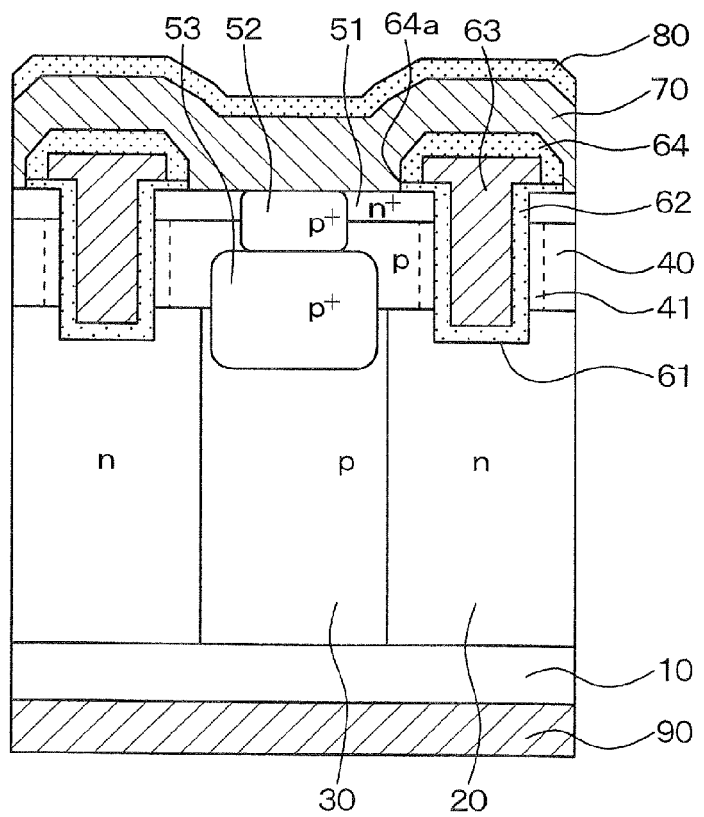
FIG. 22 is a diagram showing a cross sectional view of a semiconductor device according to other embodiments.

In the above embodiments, the embedded P+ conductive type region 53 has the ellipsoidal cross section with the curvature. Alternatively, the device may have the following feature. FIG. 22 shows a semiconductor device according to the other embodiments. As shown in FIG. 22, the embedded P+ conductive type region 53 may have a rectangular cross section. Each corner of the rectangular cross section is rounded. Alternatively, the contact P+ conductive type region 52 may have a rectangular cross section. Each corner of the rectangular cross section is rounded. This semiconductor device is manufactured by implanting the P conductive type impurity with changing the acceleration energy in turn.

In the first, second forth to twelfth embodiments, in the step in FIG. 3G, the thermal treatment is performed so that the embedded P+ conductive type region 53 is formed. Alternatively, after the step in FIG. 3E, the thermal treatment may be performed so that a part of the embedded P+ conductive type region 53 is formed. In this case, when the contact P+ conductive type region 52 is formed in the thermal treatment step in FIG. 3G, the embedded P+ conductive type region 53 is further diffused so that the embedded P+ conductive type region 53 contacts the contact P+ conductive type region 52.

In the above embodiments, in the step in FIG. 3F, the P conductive type channel layer 40 is epitaxially grown on the super junction structure. Alternatively, the P conductive type impurity is implanted in a surface portion of the super junction structure, and then, the thermal treatment is performed, so that the P conductive type channel layer 40 is formed.

Figure 23:
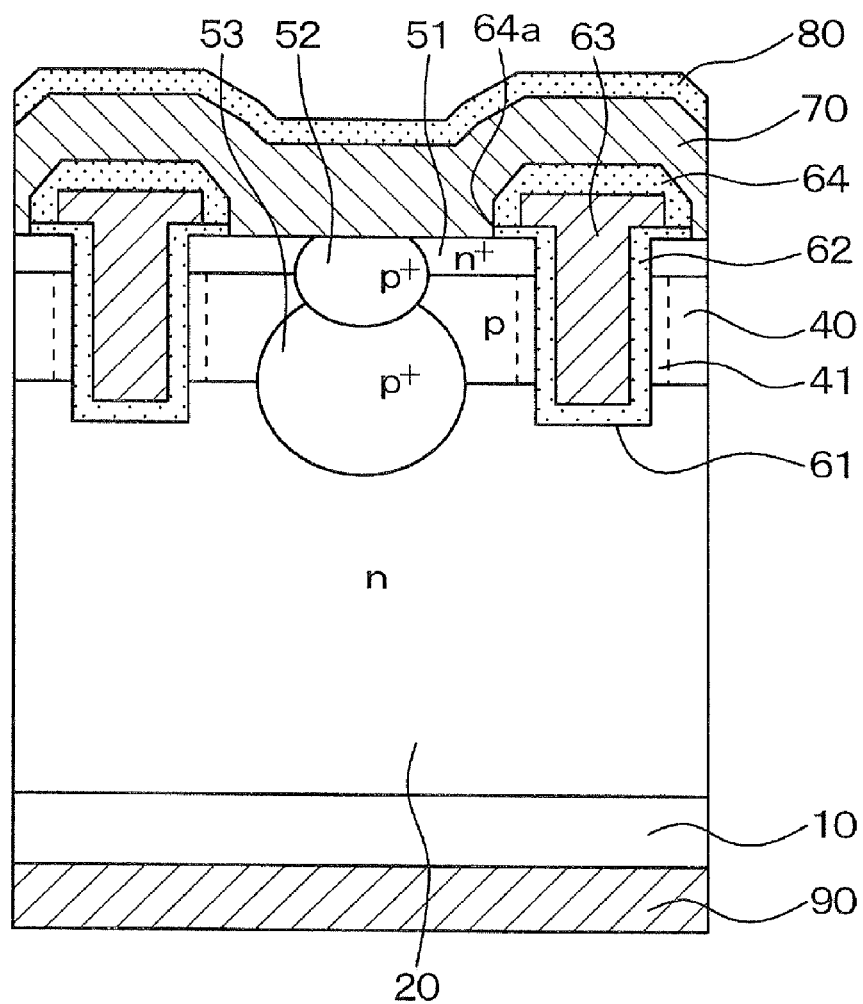
FIG. 23 is a diagram showing a cross sectional view of a semiconductor device according to other embodiments.

In the first to sixth, ninth, eleventh and twelfth embodiments, the embedded P+ conductive type region 53 extends along with a direction in parallel to the longitudinal direction of the P column 30. Alternatively, the device may have the following feature. FIG. 23 shows a semiconductor device according to the other embodiments. As shown in FIG. 23, the embedded P+ conductive type region 53 extends along with a direction perpendicular to the longitudinal direction of the P column 30. Specifically, the N columns 20 and the P columns 30 are alternately arranged in a direction perpendicular to a sheet of the drawing of FIG. 23.

In the ninth embodiment, the contact P+ conductive type region 52 is formed in the outer periphery portion. Alternatively, the contact P+ conductive type region 52 may not be formed in the outer periphery portion. In this case, the breakdown voltage at the outer periphery portion is much increased, so that the breakdown occurs at the cell portion easily. Thus, the avalanche resistance is improved. In the ninth embodiment, the embedded P+ conductive type region 53 may be formed in the P column 30 near the boundary between the outer periphery portion and the cell portion. Specifically, the trench 61 formed on an utmost outer side (i.e., the trench 61 on the left side of FIG. 17) is sandwiched between the contact P+ conductive type regions 52. In this case, the breakdown voltage of the trench 61 on the utmost outer side is improved, so that the breakdown at the boundary between the cell portion and the outer periphery portion is restricted.

In the above embodiments, the first conductive type is the N conductive type, and the second conductive type is the P conductive type. Alternatively, the first conductive type may be the P conductive type, and the second conductive type may be the N conductive type.

The above embodiments may be combined so that a semiconductor device is newly formed. For example, the third embodiment may be combined with other embodiments so that the electric field relaxation layer 54 is formed under the trench 61. Alternatively, the fifth embodiment may be combined with other embodiments so that thickness of the channel layer 40 is enlarged. Alternatively, the sixth embodiment may be combined with the first to fifth embodiments so that the N+ conductive type source region 51 may not be formed in a region between trenches 61, in which the embedded P+ conductive type region 53 is formed. Alternatively, the ninth embodiment may be combined with other embodiments so that the outer periphery portion does not include the embedded P+ conductive type region 53 at the outer circumference.

In the twelfth embodiment, the semiconductor device is the planar type device. Alternatively, the twelfth embodiment may be combined with other embodiments. For example, as described in the second embodiment, the maximum width of the embedded P+ conductive type region 53 is narrower than the maximum width of the contact P+ conductive type regions 52. Alternatively, as described in the fourth embodiment, the source electrode 70 may be alternately coupled with the N+ conductive type source region 51 and the contact P+ conductive type regions 52 along with the longitudinal direction of the N column 20 and the N column 30. Alternatively, as described in the fifth embodiment, the thickness of the P conductive type channel layer 40 may be thickened. Alternatively, as described in the sixth embodiment, the embedded P+ conductive type region 53 and the contact P+ conductive type region 52 may be formed in one region between the gate electrodes 63, and the contact P±conductive type region 52 and the N+ conductive type source region 51 may be formed in the other region between the gate electrodes 63. Alternatively, as described in the ninth and tenth embodiments, the device may include the outer periphery portion. In this case, the embedded P+ conductive type region 53 is not formed in the outer periphery portion. Thus, the embedded P+ conductive type region 53 is formed only in the cell portion, so that the breakdown voltage at the outer periphery portion increases.

The above disclosure has the following aspects.

According to a first aspect of the present disclosure, a semiconductor device includes: a substrate having a first conductive type; a plurality of first conductive type regions and a plurality of second conductive type regions disposed on the substrate, extending in a first direction, and alternately arranged in a second direction so that a super junction structure is provided; a channel layer having a second conductive type and disposed on the super junction structure; a first conductive type layer disposed in a first surface portion of the channel layer; a contact second conductive type region disposed in a second surface portion of the channel layer, which is opposite to a corresponding second conductive type region, and having an impurity concentration higher than the channel layer; a gate insulation film disposed on the channel layer; a gate electrode disposed on the gate insulation film; a surface electrode disposed on the channel layer; a backside electrode disposed on the substrate opposite to the super junction structure; and an embedded second conductive type region. A current flows between the surface electrode and the backside electrode. The embedded second conductive type region is disposed in a corresponding second conductive type region, protrudes into the channel layer, and contacts the contact second conductive type region. The embedded second conductive type region has an impurity concentration higher than the channel layer, and has a maximum impurity concentration at a position in the corresponding second conductive type region.

In the above semiconductor device, since the embedded second conductive type region has a maximum impurity concentration at a position in the corresponding second conductive type region, the impurity concentration distribution at a boundary between the embedded second conductive type region and the second conductive type region is rapidly changed. Thus, compared with a conventional semiconductor device in which the impurity concentration of the embedded second conductive type region is equal to the impurity concentration of an outer periphery portion, the electric field easily concentrates around the embedded second conductive type region. Thus, a breakdown easily occurs around the embedded second conductive type region. Accordingly, an avalanche current easily flows from the embedded second conductive type region to the contact second conductive type region, so that an avalanche resistance is improved.

Alternatively, the embedded second conductive type region may have an impurity concentration distribution.

Alternatively, the embedded second conductive type region may have a cross section perpendicular to the first direction. An equivalent concentration line of the cross section has a predetermined curvature. In this case, since the equivalent concentration line of the cross section has a predetermined curvature, so that an outline of the cross section has an ellipsoidal shape. Accordingly, for example, compared with a case where the cross section of the embedded second conductive type region is a rectangular, the electric field concentration occurs in a wide area around the embedded second conductive type region. Thus, an area in which the breakdown occurs is enlarged, so that an operation resistance is reduced.

Alternatively, the embedded second conductive type region may have a maximum width in the second direction, which is smaller than a maximum width of the corresponding second conductive type region in the second direction. The embedded second conductive type region is disposed in the channel layer and the corresponding second conductive type region. Further, the maximum width of the embedded second conductive type region in the second direction may be smaller than a maximum width of the contact second conductive type region in the second direction. In this case, since the width of the embedded second conductive type region is narrower than the contact second conductive type region, when the avalanche current flows from the embedded second conductive type region to the contact second conductive type region, the avalanche current is restricted from leaking from the embedded second conductive type region to the channel layer. Further, the avalanche resistance is improved. Further, since the width of the embedded second conductive type region is narrower than the contact second conductive type region, when the avalanche current flows from the embedded second conductive type region to the contact second conductive type region, the operation resistance is reduced. Thus, the avalanche resistance is improved. Further, compared with a case where the width of the embedded second conductive type region is equal to the contact second conductive type region, the distance between the inversion layer formed in the channel layer facing the gate electrode and the embedded second conductive type region is increased, so that a threshold voltage is stabilized.

Alternatively, the channel layer may include a plurality of channel forming layers, which are stacked. The embedded second conductive type region includes a plurality of embedded second conductive type region forming layers, which are coupled with each other in a depth direction. The depth direction is perpendicular to the first direction and the second direction. At least one of the embedded second conductive type region forming layers has a maximum impurity concentration at a position in the corresponding second conductive type region.

Alternatively, the semiconductor device may further include: a cell portion; and an outer periphery portion. The current flows between the surface electrode and the backside electrode in the cell portion. The outer periphery portion surrounds the cell portion. The embedded second conductive type region is not disposed in the second conductive type regions of the outer periphery portion. In this case, since the embedded second conductive type region is not disposed in the second conductive type regions of the outer periphery portion, the breakdown voltage at the outer periphery portion is improved, compared with a case where the embedded second conductive type region is disposed in the second conductive type regions of the outer periphery portion. Specifically, the breakdown easily occurs in the cell portion, and the avalanche current can be absorbed in a whole of the cell portion, compared with the case where the embedded second conductive type region is disposed in the second conductive type regions of the outer periphery portion.

Alternatively, the semiconductor device may further includes: a plurality of trenches penetrating the channel layer and reaching the first conductive type regions. The trenches have a stripe pattern. The gate insulation film is disposed on an inner wall of each trench. The gate electrode is disposed on the gate insulation film in each trench. The trenches, the gate insulation film and the gate electrode provide a trench gate structure. The first conductive type layer contacts a sidewall of each trench. The embedded second conductive type region has an impurity concentration equal to the second conductive type regions at a position, which is deeper than a bottom of the trenches. In this case, since the embedded second conductive type region is deeper than the bottom of the trenches, the electric field concentrates under the embedded second conductive type region rather than the trench. Thus, the breakdown occurs under the embedded second conductive type region.

Alternatively, the embedded second conductive type region is disposed between adjacent two trenches.

Alternatively, the semiconductor device may further include: an electric field relaxation layer disposed in a corresponding first conductive type region. The electric field relaxation layer contacts a bottom of a corresponding trench. In this case, since the electric field relaxation layer contacts a bottom of a corresponding trench, the electric field concentration under the trench is restricted. Specifically, the breakdown is restricted from occurring under the trench. More specifically, the break down occurs easily under the embedded second conductive type region. Thus, the gate insulation film is restricted from being damaged or broken.

Further, the electric field relaxation layer may have a width in the second direction, which is smaller than a width of the corresponding trench in the second direction. In this case, compared with a case where the width of the electric field relaxation layer is larger than the corresponding trench, i.e., compared with a case where the electric field relaxation layer is formed around a part of the trench near the first conductive type region, the current path in the channel layer from the inversion layer to the first conductive type region is restricted from being blocked by the electric field relaxation layer. Thus, the increase of the on-state resistance is restricted.

Alternatively, each trench may extend in the first direction. The first conductive type layer extends in the first direction. The contact second conductive type region is disposed between the first conductive type layer contacting one trench and the first conductive type layer contacting an adjacent trench. The contact second conductive type region is divided into a plurality of contact second conductive type region portions along with the first direction. The contact second conductive type region portions are separated from each other by a predetermined interval. A distance between the first conductive type layer contacting the one trench and the first conductive type layer contacting the adjacent trench, which are disposed in the predetermined interval, is shorter than a distance between the first conductive type layer contacting the one trench and the first conductive type layer contacting the adjacent trench, which sandwich a corresponding contact second conductive type region portion. In this case, the distance between adjacent two trenches is shortened, so that the integration of the device is improved, compared with a case where the trench, the first conductive type layer and the contact second conductive type region extend in the extending direction of the first and second conductive type regions.

Alternatively, the trenches may include first to third trenches, which are adjacent to each other. The embedded second conductive type region and the contact second conductive type region are arranged between the first and second trenches. The contact second conductive type region and the first conductive type layer are arranged between the second and third trenches. In this case, the first conductive type layer is not formed between the first and second trenches, in which the embedded second conductive type region is formed. Thus, a parasitic transistor is not formed near the embedded second conductive type region. Accordingly, when the avalanche current flows from the embedded second conductive type region to the contact second conductive type region, the avalanche current is restricted from flowing through the first conductive type layer.

Alternatively, the contact second conductive type region and the trenches may extend in the second direction, which is perpendicular to the first direction. The embedded second conductive type region extends in the first direction. In this case, since the contact second conductive type region extends in the second direction perpendicular to the first direction, in which the embedded second conductive type region extends, the contact second conductive type region easily contacts the embedded second conductive type region, compared with a case where the contact second conductive type region extends along with the first direction as the extending direction of the embedded second conductive type region. Thus, the shift of alignment of the contact second conductive type region and the embedded second conductive type region is reduced.

Further, the embedded second conductive type region may be divided into a plurality of embedded second conductive type region portions along with the first direction. The embedded second conductive type region portions are separated from each other by a predetermined interval, and each embedded second conductive type region portion is disposed under the contact second conductive type region. In this case, since the embedded second conductive type region portions contacting the trenches is not formed in the channel layer, the current path disposed between the channel layer and the first conductive type region is restricted from being blocked by the embedded second conductive type region portions. Thus, the increase of the on-state resistance is improved.

Alternatively, the semiconductor device may further include: a cell portion; and an outer periphery portion. The current flows between the surface electrode and the backside electrode in the cell portion. The outer periphery portion surrounds the cell portion. The trenches in the cell portion extend in the first direction. The embedded second conductive type region in the cell portion and the outer periphery portion extends in the first direction. The embedded second conductive type region has an end in the outer periphery portion, which is disposed on an outer side of an end of the trench in the first direction. In this case, the electric field concentration is restricted from occurring at the end of the trench in the extending direction, compared with a case where the embedded second conductive type region has the end, which is disposed on the inside of the end of the trench.

Further, the embedded second conductive type region may be divided into a plurality of embedded second conductive type region portions along with the first direction. The embedded second conductive type region portions are separated from each other by a predetermined interval. In this case, the embedded second conductive type region portions are not partially formed, and therefore, the current path, in which the embedded second conductive type region portions are not formed, is not narrowed by the embedded second conductive type region portions. Thus, the breakdown voltage is held, and the on-state resistance is reduced.

According to a second aspect of the present disclosure, a method for manufacturing a semiconductor device includes: forming a first conductive type region film on a substrate having a first conductive type; forming a plurality of first trenches on the first conductive type region film to reach the substrate so that the first conductive type region film is divided into a plurality of first conductive type regions, which are separated from each other with the first trenches; filling each first trench with a second conductive type region film; polishing a surface of the second conductive type region film so that the second conductive type region film is divided into a plurality of second conductive type regions, and the first conductive type regions and the second conductive type regions provide a super junction structure, wherein the first conductive type regions and the second conductive type regions extend in a first direction, and wherein the first conductive type regions and the second conductive type regions are alternatively arranged in a second direction; implanting a second conductive type impurity into the second conductive type regions; forming a channel layer having a second conductive type on the super junction structure; forming a plurality of second trenches to penetrate the channel layer and to reach a corresponding first conductive type region, wherein the second trenches have a stripe pattern; forming a gate insulation film on an inner wall of each second trench, and forming a gate electrode on the gate insulation film in each second trench, so that the second trenches, the gate insulation film and the gate electrode provide a trench gate structure; implanting a first conductive type impurity into a surface portion of the channel layer; implanting a second conductive type impurity into another surface portion of the channel layer; and heating the substrate so that the second conductive type impurity in the channel layer is diffused, and a contact second conductive type region is formed in the another surface portion of the channel layer, which is opposite to a corresponding second conductive type region. The contact second conductive type region has an impurity concentration higher than the channel layer. In the heating of the substrate, the first conductive type impurity in the channel layer is diffused, and a first conductive type layer is formed in the surface portion of the channel layer. The first conductive type layer has the first conductive type, and contacts a sidewall of a corresponding trench. In the heating of the substrate, the second conductive type impurity in the second conductive type regions is diffused, and an embedded second conductive type region is formed in a corresponding second conductive type region. The embedded second conductive type region has an end, which protrudes into the channel layer and contacts the contact second conductive type region. The embedded second conductive type region has the other end, which is deeper than a bottom of a corresponding trench. The embedded second conductive type region has an impurity concentration higher than the channel layer, and has a maximum impurity concentration at a position in the corresponding second conductive type region.

In the above method, the second conductive type impurity is implanted in the second conductive region, so that the embedded second conductive type region is formed after the heat treatment. Accordingly, the thermal treatment temperature is low, and the thermal treatment time is short, compared with a conventional case where the second conductive type impurity is implanted in the channel layer, and the embedded second conductive type region is formed to reach the second conductive type region after the heat treatment. Thus, the charge balance between the first and second conductive type regions is not changed.

According to a third aspect of the present disclosure, a method for manufacturing a semiconductor device includes: forming a first conductive type region film on a substrate having a first conductive type; forming a plurality of first trenches on the first conductive type region film to reach the substrate so that the first conductive type region film is divided into a plurality of first conductive type regions, which are separated from each other with the first trenches; filling each first trench with a second conductive type region film, and forming the second conductive type region film on the first conductive type regions; implanting a second conductive type impurity into the second conductive type region film in each trench with using the second conductive type region film on the first conductive type regions as a mask; polishing a surface of the second conductive type region film so that the second conductive type region film is divided into a plurality of second conductive type regions, and the first conductive type regions and the second conductive type regions provide a super junction structure, wherein the first conductive type regions and the second conductive type regions extend in a first direction, and wherein the first conductive type regions and the second conductive type regions are alternatively arranged in a second direction; forming a channel layer having a second conductive type on the super junction structure; forming a plurality of second trenches to penetrate the channel layer and to reach a corresponding first conductive type region, wherein the second trenches have a stripe pattern; forming a gate insulation film on an inner wall of each second trench, and forming a gate electrode on the gate insulation film in each second trench, so that the second trenches, the gate insulation film and the gate electrode provide a trench gate structure; implanting a first conductive type impurity into a surface portion of the channel layer; implanting a second conductive type impurity into another surface portion of the channel layer; and heating the substrate so that the second conductive type impurity in the channel layer is diffused, and a contact second conductive type region is formed in the another surface portion of the channel layer, which is opposite to a corresponding second conductive type region. The contact second conductive type region has an impurity concentration higher than the channel layer. In the heating of the substrate, the first conductive type impurity in the channel layer is diffused, and a first conductive type layer is formed in the surface portion of the channel layer. The first conductive type layer has the first conductive type, and contacts a sidewall of a corresponding trench. In the heating of the substrate, the second conductive type impurity in the second conductive type regions is diffused, and an embedded second conductive type region is formed in a corresponding second conductive type region. The embedded second conductive type region has an end, which protrudes into the channel layer and contacts the contact second conductive type region. The embedded second conductive type region has the other end, which is deeper than a bottom of a corresponding trench. The embedded second conductive type region has an impurity concentration higher than the channel layer, and has a maximum impurity concentration at a position in the corresponding second conductive type region.

In the above method, when the second conductive type region is embedded in the trench, the second conductive type region film is formed on the first conductive type region, and the second conductive type impurity is implanted in the second conductive type region film in the trench with using the second conductive type region film on the first conductive type region as a mask. Accordingly, it is not necessary to prepare a new mask, so that the manufacturing method is simplified.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a substrate having a first conductive type;
   a plurality of first conductive type regions and a plurality of second conductive type regions disposed on the substrate, extending in a first direction, and alternately arranged in a second direction so that a super junction structure is provided;
   a channel layer having a second conductive type and disposed on the super junction structure;
   a first conductive type layer disposed in a first surface portion of the channel layer;
   a contact second conductive type region disposed in a second surface portion of the channel layer, which is opposite to a corresponding second conductive type region, and having an impurity concentration higher than the channel layer;

a gate insulation film disposed on the channel layer;
a gate electrode disposed on the gate insulation film;
a surface electrode disposed on the channel layer;
a backside electrode disposed on the substrate opposite to the super junction structure; and
an embedded second conductive type region,
wherein a current flows between the surface electrode and the backside electrode,
wherein the embedded second conductive type region is disposed in a corresponding second conductive type region, protrudes into the channel layer, and contacts the contact second conductive type region, and
wherein the embedded second conductive type region has an impurity concentration higher than the channel layer, and has a maximum impurity concentration at a position in the corresponding second conductive type region.

2. The semiconductor device according to claim 1,
wherein the embedded second conductive type region has an impurity concentration distribution.

3. The semiconductor device according to claim 1,
wherein the embedded second conductive type region has a cross section perpendicular to the first direction, and
wherein an equivalent concentration line of the cross section has a predetermined curvature.

4. The semiconductor device according to claim 1,
wherein the embedded second conductive type region has a maximum width in the second direction, which is smaller than a maximum width of the corresponding second conductive type region in the second direction, and
wherein the embedded second conductive type region is disposed in the channel layer and the corresponding second conductive type region.

5. The semiconductor device according to claim 4,
wherein the maximum width of the embedded second conductive type region in the second direction is smaller than a maximum width of the contact second conductive type region in the second direction.

6. The semiconductor device according to claim 1,
wherein the channel layer includes a plurality of channel forming layers, which are stacked,
wherein the embedded second conductive type region includes a plurality of embedded second conductive type region forming layers, which are coupled with each other in a depth direction,
wherein the depth direction is perpendicular to the first direction and the second direction, and
wherein at least one of the embedded second conductive type region forming layers has a maximum impurity concentration at a position in the corresponding second conductive type region.

7. The semiconductor device according to claim 1, further comprising:
a cell portion; and
an outer periphery portion,
wherein the current flows between the surface electrode and the backside electrode in the cell portion,
wherein the outer periphery portion surrounds the cell portion, and
wherein the embedded second conductive type region is not disposed in the second conductive type regions of the outer periphery portion.

8. The semiconductor device according to claim 1, further comprising:
a plurality of trenches penetrating the channel layer and reaching the first conductive type regions,
wherein the trenches have a stripe pattern,
wherein the gate insulation film is disposed on an inner wall of each trench,
wherein the gate electrode is disposed on the gate insulation film in each trench,
wherein the trenches, the gate insulation film and the gate electrode provide a trench gate structure,
wherein the first conductive type layer contacts a sidewall of each trench, and
wherein the embedded second conductive type region has an impurity concentration equal to the second conductive type regions at a position, which is deeper than a bottom of the trenches.

9. The semiconductor device according to claim 8,
wherein the embedded second conductive type region is disposed between adjacent two trenches.

10. The semiconductor device according to claim 8, further comprising:
an electric field relaxation layer disposed in a corresponding first conductive type region,
wherein the electric field relaxation layer contacts a bottom of a corresponding trench.

11. The semiconductor device according to claim 10,
wherein the electric field relaxation layer has a width in the second direction, which is smaller than a width of the corresponding trench in the second direction.

12. The semiconductor device according to claim 8,
wherein each trench extends in the first direction,
wherein the first conductive type layer extends in the first direction,
wherein the contact second conductive type region is disposed between the first conductive type layer contacting one trench and the first conductive type layer contacting an adjacent trench,
wherein the contact second conductive type region is divided into a plurality of contact second conductive type region portions along with the first direction,
wherein the contact second conductive type region portions are separated from each other by a predetermined interval, and
wherein a distance between the first conductive type layer contacting the one trench and the first conductive type layer contacting the adjacent trench, which are disposed in the predetermined interval, is shorter than a distance between the first conductive type layer contacting the one trench and the first conductive type layer contacting the adjacent trench, which sandwich a corresponding contact second conductive type region portion.

13. The semiconductor device according to claim 8,
wherein the trenches include first to third trenches, which are adjacent to each other,
wherein the embedded second conductive type region and the contact second conductive type region are arranged between the first and second trenches, and
wherein the contact second conductive type region and the first conductive type layer are arranged between the second and third trenches.

14. The semiconductor device according to claim 8,
wherein the contact second conductive type region and the trenches extend in the second direction, which is perpendicular to the first direction, and
wherein the embedded second conductive type region extends in the first direction.

15. The semiconductor device according to claim 14,
wherein the embedded second conductive type region is divided into a plurality of embedded second conductive type region portions along with the first direction, wherein the embedded second conductive type region portions are separated from each other by a predetermined interval, and wherein each embedded second conductive type region portion is disposed under the contact second conductive type region.

16. The semiconductor device according to claim 10, further comprising:

a cell portion; and an outer periphery portion, wherein the current flows between the surface electrode and the backside electrode in the cell portion, wherein the outer periphery portion surrounds the cell portion, wherein the trenches in the cell portion extend in the first direction, wherein the embedded second conductive type region in the cell portion and the outer periphery portion extends in the first direction, and wherein the embedded second conductive type region has an end in the outer periphery portion, which is disposed on an outer side of an end of the trench in the first direction.

17. The semiconductor device according to claim 16, wherein the embedded second conductive type region is divided into a plurality of embedded second conductive type region portions along with the first direction, and wherein the embedded second conductive type region portions are separated from each other by a predetermined interval.

18. A method for manufacturing a semiconductor device comprising:

forming a first conductive type region film on a substrate having a first conductive type;

forming a plurality of first trenches on the first conductive type region film to reach the substrate so that the first conductive type region film is divided into a plurality of first conductive type regions, which are separated from each other with the first trenches;

filling each first trench with a second conductive type region film;

polishing a surface of the second conductive type region film so that the second conductive type region film is divided into a plurality of second conductive type regions, and the first conductive type regions and the second conductive type regions provide a super junction structure, wherein the first conductive type regions and the second conductive type regions extend in a first direction, and wherein the first conductive type regions and the second conductive type regions are alternatively arranged in a second direction;

implanting a second conductive type impurity into the second conductive type regions;

forming a channel layer having a second conductive type on the super junction structure;

forming a plurality of second trenches to penetrate the channel layer and to reach a corresponding first conductive type region, wherein the second trenches have a stripe pattern;

forming a gate insulation film on an inner wall of each second trench, and forming a gate electrode on the gate insulation film in each second trench, so that the second trenches, the gate insulation film and the gate electrode provide a trench gate structure;

implanting a first conductive type impurity into a surface portion of the channel layer;

implanting a second conductive type impurity into another surface portion of the channel layer; and heating the substrate so that the second conductive type impurity in the channel layer is diffused, and a contact second conductive type region is formed in the another surface portion of the channel layer, which is opposite to a corresponding second conductive type region, wherein the contact second conductive type region has an impurity concentration higher than the channel layer, wherein, in the heating of the substrate, the first conductive type impurity in the channel layer is diffused, and a first conductive type layer is formed in the surface portion of the channel layer, wherein the first conductive type layer has the first conductive type, and contacts a sidewall of a corresponding second trench, wherein, in the heating of the substrate, the second conductive type impurity in the second conductive type regions is diffused, and an embedded second conductive type region is formed in a corresponding second conductive type region, wherein the embedded second conductive type region has an end, which protrudes into the channel layer and contacts the contact second conductive type region, wherein the embedded second conductive type region has the other end, which is deeper than a bottom of a corresponding second trench, and wherein the embedded second conductive type region has an impurity concentration higher than the channel layer, and has a maximum impurity concentration at a position in the corresponding second conductive type region.

19. A method for manufacturing a semiconductor device comprising:

forming a first conductive type region film on a substrate having a first conductive type;

forming a plurality of first trenches on the first conductive type region film to reach the substrate so that the first conductive type region film is divided into a plurality of first conductive type regions, which are separated from each other with the first trenches;

filling each first trench with a second conductive type region film, and forming the second conductive type region film on the first conductive type regions;

implanting a second conductive type impurity into the second conductive type region film in each first trench with using the second conductive type region film on the first conductive type regions as a mask;

polishing a surface of the second conductive type region film so that the second conductive type region film is divided into a plurality of second conductive type regions, and the first conductive type regions and the second conductive type regions provide a super junction structure, wherein the first conductive type regions and the second conductive type regions extend in a first direction, and wherein the first conductive type regions and the second conductive type regions are alternatively arranged in a second direction;

forming a channel layer having a second conductive type on the super junction structure;

forming a plurality of second trenches to penetrate the channel layer and to reach a corresponding first conductive type region, wherein the second trenches have a stripe pattern;

forming a gate insulation film on an inner wall of each second trench, and forming a gate electrode on the gate insulation film in each second trench, so that the second trenches, the gate insulation film and the gate electrode provide a trench gate structure;

implanting a first conductive type impurity into a surface portion of the channel layer;

implanting a second conductive type impurity into another surface portion of the channel layer; and heating the substrate so that the second conductive type impurity in the channel layer is diffused, and a contact second conductive type region is formed in the another surface portion of the channel layer, which is opposite to a corresponding second conductive type region, wherein the contact second conductive type region has an impurity concentration higher than the channel layer, wherein, in the heating of the substrate, the first conductive type impurity in the channel layer is diffused, and a first conductive type layer is formed in the surface portion of the channel layer, wherein the first conductive type layer has the first conductive type, and contacts a sidewall of a corresponding second trench, wherein, in the heating of the substrate, the second conductive type impurity in the second conductive type regions is diffused, and an embedded second conductive type region is formed in a corresponding second conductive type region, wherein the embedded second conductive type region has an end, which protrudes into the channel layer and contacts the contact second conductive type region, wherein the embedded second conductive type region has the other end, which is deeper than a bottom of a corresponding second trench, and wherein the embedded second conductive type region has an impurity concentration higher than the channel layer, and has a maximum impurity concentration at a position in the corresponding second conductive type region.

* * * * *